(12) United States Patent
Gutierrez

(10) Patent No.: US 8,869,625 B2
(45) Date of Patent: Oct. 28, 2014

(54) MEMS ACTUATOR/SENSOR

(75) Inventor: Roman C. Gutierrez, Arcadia, CA (US)

(73) Assignee: DigitalOptics Corporation MEMS, Arcadia, CA (US)

( * ) Notice: Subject to any disclaimer, the term of this patent is extended or adjusted under 35 U.S.C. 154(b) by 311 days.

(21) Appl. No.: 13/247,925

(22) Filed: Sep. 28, 2011

(65) Prior Publication Data
US 2013/0075237 A1 Mar. 28, 2013

(51) Int. Cl.
G01B 7/16 (2006.01)
H03K 17/98 (2006.01)
H01H 59/00 (2006.01)
H02N 1/00 (2006.01)
G06F 3/01 (2006.01)
B81B 3/00 (2006.01)
H01H 3/00 (2006.01)

(52) U.S. Cl.
CPC ............... *G06F 3/016* (2013.01); *H03K 17/98* (2013.01); *H03K 2217/96062* (2013.01); *B81B 2203/051* (2013.01); *H01H 59/0009* (2013.01); *H01H 2003/008* (2013.01); *H02N 1/00* (2013.01); *H02N 1/006* (2013.01); *B81B 3/0037* (2013.01)
USPC .................................. 73/777; 73/780

(58) Field of Classification Search
USPC ........................................... 73/760, 777, 780
See application file for complete search history.

(56) References Cited

U.S. PATENT DOCUMENTS

| | | | |
|---|---|---|---|
| 4,333,722 A | 6/1982 | Lee | |
| 4,384,778 A | 5/1983 | Lee et al. | |
| 4,408,857 A | 10/1983 | Frank | |
| 4,496,217 A | 1/1985 | Aoyagi | |
| 4,716,432 A | 12/1987 | Stephany | |
| 4,860,040 A | 8/1989 | Tamamura et al. | |
| 5,150,260 A | 9/1992 | Chigira | |
| 5,386,294 A | 1/1995 | Ototake et al. | |
| 5,699,621 A | 12/1997 | Trumper et al. | |
| 5,825,560 A | 10/1998 | Ogura et al. | |
| 5,986,826 A | 11/1999 | Kosaka et al. | |
| 6,033,131 A | 3/2000 | Ghosh | |
| 6,068,801 A | 5/2000 | Bodo et al. | |
| 6,205,267 B1 | 3/2001 | Aksyuk et al. | |
| 6,262,827 B1 | 7/2001 | Ueda et al. | |
| 6,392,703 B1 | 5/2002 | Uchino et al. | |
| 6,407,560 B1 * | 6/2002 | Walraven et al. | ........ 324/754.23 |
| 6,426,777 B1 | 7/2002 | Sato | |
| 6,447,449 B1 * | 9/2002 | Fleischman et al. | .......... 600/405 |
| 6,497,141 B1 | 12/2002 | Turner et al. | |
| 6,535,311 B1 | 3/2003 | Lindquist | |
| 6,674,383 B2 | 1/2004 | Horsley et al. | |
| 6,675,671 B1 | 1/2004 | Jokiel et al. | |
| 6,798,312 B1 * | 9/2004 | Harris et al. | ................. 333/24.2 |
| 6,847,907 B1 | 1/2005 | Novotny | |
| 6,850,675 B1 | 2/2005 | Calvet et al. | |
| 6,914,635 B2 | 7/2005 | Ostergard | |
| 6,958,777 B1 | 10/2005 | Pine | |
| 7,027,206 B2 | 4/2006 | Mochizuki | |
| 7,038,150 B1 | 5/2006 | Polosky et al. | |

(Continued)

*Primary Examiner* — Max Noori

(74) *Attorney, Agent, or Firm* — Haynes and Boone, LLP

(57) ABSTRACT

A device can have an electrostatic MEMS actuator and a capacitive sensor in electrical communication with the electrostatic MEMS actuator. The capacitive sensor can be configured to determine a capacitance of the electrostatic MEMS actuator while a force is being applied to the electrostatic MEMS actuator as the electrostatic MEMS actuator is being actuated. The device can be used to construct a keyboard having tactile feedback, for example.

30 Claims, 25 Drawing Sheets

(56) References Cited

U.S. PATENT DOCUMENTS

| | | |
|---|---|---|
| 7,113,688 B2 | 9/2006 | Calvet et al. |
| 7,154,199 B2 | 12/2006 | Yasuda |
| 7,183,633 B2 * | 2/2007 | Daneman et al. ............. 257/678 |
| 7,266,272 B1 | 9/2007 | Calvet et al. |
| 7,285,879 B2 | 10/2007 | Osaka |
| 7,372,074 B2 | 5/2008 | Milne et al. |
| 7,545,591 B1 | 6/2009 | Tong et al. |
| 7,555,210 B2 | 6/2009 | Calvet |
| 7,646,969 B2 | 1/2010 | Calvet et al. |
| 7,705,909 B2 | 4/2010 | Ishizawa et al. |
| 7,720,366 B2 | 5/2010 | Iwasaki et al. |
| 7,838,322 B1 | 11/2010 | Vargo et al. |
| 7,928,522 B2 * | 4/2011 | Zhu et al. ...................... 257/415 |
| 7,990,628 B1 | 8/2011 | Calvet et al. |
| 8,017,847 B1 * | 9/2011 | Chuang ....................... 84/477 R |
| 8,432,362 B2 * | 4/2013 | Cheng et al. .................. 345/168 |
| 8,466,858 B2 * | 6/2013 | Govil ............................. 345/85 |
| 2001/0004420 A1 | 6/2001 | Kuwana et al. |
| 2002/0006687 A1 | 1/2002 | Lam |
| 2002/0070634 A1 | 6/2002 | Tai et al. |
| 2002/0105699 A1 | 8/2002 | Miracky et al. |
| 2002/0125789 A1 | 9/2002 | Brandt |
| 2003/0048036 A1 | 3/2003 | Lemkin |
| 2003/0062422 A1 | 4/2003 | Fateley et al. |
| 2003/0076421 A1 | 4/2003 | Dutta |
| 2003/0086751 A1 | 5/2003 | Culpepper |
| 2003/0210116 A1 | 11/2003 | Lane et al. |
| 2004/0048410 A1 | 3/2004 | O'Brien et al. |
| 2004/0066494 A1 | 4/2004 | Lee et al. |
| 2004/0183936 A1 | 9/2004 | Kim et al. |
| 2004/0189969 A1 | 9/2004 | Mizuno |
| 2004/0201773 A1 | 10/2004 | Ostergard |
| 2005/0002008 A1 | 1/2005 | De Weerdt et al. |
| 2005/0002086 A1 | 1/2005 | Starkweather et al. |
| 2005/0007489 A1 | 1/2005 | Ahn et al. |
| 2005/0095813 A1 | 5/2005 | Zhu et al. |
| 2005/0131390 A1 * | 6/2005 | Heinrich et al. .................. 606/1 |
| 2005/0139542 A1 | 6/2005 | Dickensheets et al. |
| 2005/0148433 A1 | 7/2005 | Wang et al. |
| 2005/0219399 A1 | 10/2005 | Sato et al. |
| 2005/0249487 A1 | 11/2005 | Gutierrez |
| 2006/0028320 A1 | 2/2006 | Osaka |
| 2006/0033938 A1 | 2/2006 | Kopf et al. |
| 2006/0057520 A1 * | 3/2006 | Saia et al. ..................... 431/281 |
| 2006/0183332 A1 | 8/2006 | Kang |
| 2006/0192858 A1 | 8/2006 | Calvet |
| 2006/0193618 A1 | 8/2006 | Calvet |
| 2006/0204242 A1 | 9/2006 | Gutierrez et al. |
| 2006/0209012 A1 | 9/2006 | Hagood, IV |
| 2006/0219006 A1 | 10/2006 | Nasiri et al. |
| 2006/0250325 A1 | 11/2006 | Hagood et al. |
| 2007/0133976 A1 | 6/2007 | Gutierrez |
| 2008/0020573 A1 | 1/2008 | Birkmeyer et al. |
| 2008/0044172 A1 | 2/2008 | Tang et al. |
| 2010/0232777 A1 | 9/2010 | Tseng et al. |
| 2010/0284081 A1 | 11/2010 | Gutierrez et al. |
| 2011/0026148 A1 | 2/2011 | Tanimura et al. |
| 2011/0216030 A1 * | 9/2011 | Lee ............................... 345/174 |
| 2011/0291934 A1 * | 12/2011 | Yang ............................ 345/168 |
| 2012/0034954 A1 * | 2/2012 | Tabe .............................. 455/566 |

* cited by examiner

MEMS ACTUATOR/SENSOR

TECHNICAL FIELD

One or more embodiments of the invention relate generally to microelectromechanical systems (MEMS) and, more particularly, to MEMS actuators that also function as sensors.

BACKGROUND

Electrostatic microelectromechanical systems (MEMS) actuators are well known. Such MEMS actuators are used in a verity of applications. For example, a MEMS actuator can be used to move a lens to focus a miniature camera in a cellular telephone.

In some instances, it may be desirable to sense a parameter associated with a device that uses a MEMS actuator. For example, it may be desirable to sense the position of the MEMS actuator or to sense the magnitude of a force applied to the MEMS actuator. As a result, there is a need for a MEMS actuator that can function as a sensor.

SUMMARY

In accordance with an embodiment, a device can have an electrostatic MEMS actuator and a capacitive sensor in electrical communication with the electrostatic MEMS actuator. The capacitive sensor can be configured to determine a capacitance of the electrostatic MEMS actuator. The capacitance of the electrostatic MEMS actuator can depend upon the position or state of the electrostatic MEMS actuator. A force effector can be configured to facilitate the application of an external force to the electrostatic MEMS actuator. For example, the force effector can be a manual control such as a key, a button, a toggle, or a knob.

In accordance with an embodiment, a switch can have a manual control such as a key, a button, a toggle, or a knob. An electrostatic MEMS actuator can be responsive to the manual control. A capacitive sensor can sense a change of state of the manual control by sensing a change of state of the electrostatic MEMS actuator. A response, e.g., a signal, can be provided when there is a change of state of the manual control.

In accordance with an embodiment, a keyboard can have one or more keys. For example, the keyboard can be a computer keyboard. One or more electrostatic MEMS actuators can be configured to move in response to movement of the key(s). A capacitive sensor can be in electrical communication with the electrostatic MEMS actuator(s) and can be configured to determine a capacitance of the electrostatic MEMS actuator(s). A change in the capacitance of one of the electrostatic MEMS actuators can indicate that an associated one of the keys has been pressed.

In accordance with an embodiment, a method can comprise sensing a capacitance of an electrostatic MEMS actuator and reacting to a change in the sensed capacitance of the electrostatic MEMS actuator. The reaction to the change in the capacitance of the electrostatic MEMS actuator can include the providing of a signal, such as a signal indicating that a manual control has been moved. For example, the manual control can be a key of a computer keyboard. The reaction to the change in the capacitance of the electrostatic MEMS actuator can include a change in the force provided by the electrostatic MEMS actuator. For example, a resistance to movement of the key can be varied as the key is pressed.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Methods and systems are disclosed for using an actuator, such as an electrostatic MEMS actuator, as a sensor at the same time that force is being applied to the actuator. The force can be applied via an effector. The effector can be a manual control such as a key, a button, a toggle, or a knob. A parameter of the actuator, such as capacitance, can be sensed or determined. The parameter can be used in a feedback loop to at least partially control the actuator. The parameter can be used for various other purposes. For example, the parameter can be used to indicate to a computer that a key of a computer keyboard has been pressed.

Examples of suitable actuators are discussed below. Generally, any type of electrostatic MEMS actuator may be used according to various embodiments. Thus, such examples are not by way of limitation.

Systems and methods are disclosed herein to provide microelectromechanical systems (MEMS) cascaded electrostatic actuators and applications therefor. The actuators can have enhanced travel and/or force capability. For example, in accordance with an embodiment of the invention, an actuator can comprise a plurality of alternating fingers, electrodes, plates, or layers upon which opposite charges can be placed so as to cause the alternating layers to move toward one another.

A plurality of layers can be placed in tandem or cascaded so as to provide increased travel for the actuator. The dimensions of the layers (such as the areas thereof and the gap distance therebetween) can be configured so as to provide increased force for the actuator.

Embodiments of the actuator can be fabricated using MEMS fabrication techniques. Embodiments of the actuator can be fabricated using integrated circuit (IC) manufacturing techniques and/or materials.

Figure 1:
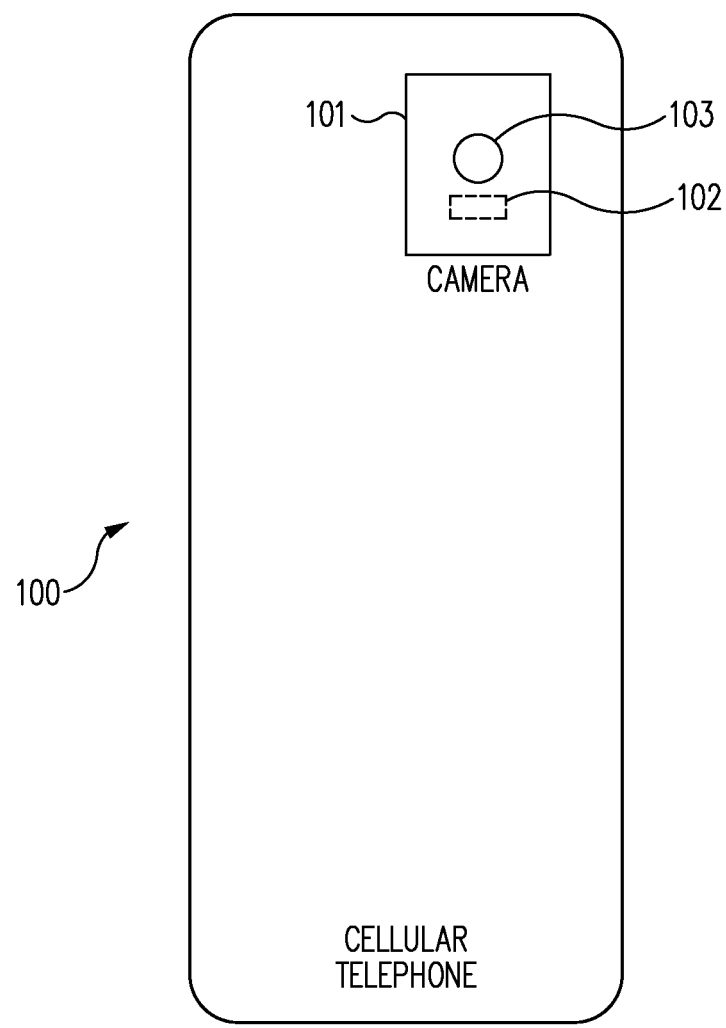
FIG. 1 shows a cellular telephone, in accordance with an embodiment.

FIG. 1 shows a cellular telephone 100, in accordance with an embodiment. The cellular telephone 100 can comprise a miniature camera 101. The miniature camera 101 can comprise a cascaded electrostatic actuator 102 for moving at least one lens (such as lens 2801 of FIG. 28) of a lens assembly 103. Such movement can effect focusing, zooming, and/or image stabilization, for example. Such movement can effect the sensing of a key of a keyboard being pressed as discussed below, for example.

Figure 2:
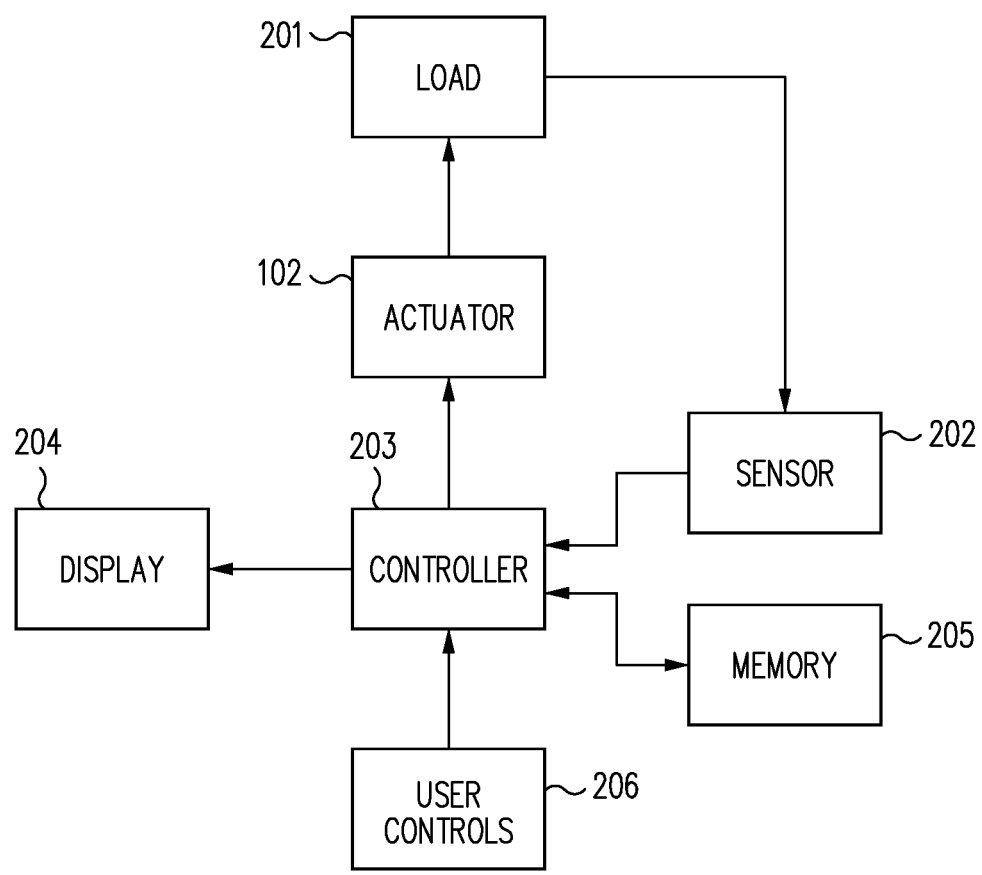
FIG. 2 is a block diagram of an actuator system, in accordance with an embodiment.

FIG. 2 is a block diagram of an actuator system, in accordance with an embodiment. The actuator 102 can move a load 201. The load 201 can be the lens 2801 of the lens assembly 103 for FIG. 1, for example. The actuator 102 can be responsive to a controller 203.

The controller 203 can be a microprocessor, such as a custom microprocessor or a general purpose microprocessor. The controller 203 can be dedicated to the operation of the actuator 102 or the controller 103 can also provide other functionality, such as functionally commonly associated with at least some portion of the operation of the cellular telephone 100 of FIG. 1.

A sensor 202 can be responsive to the load 201. For example, the sensor 202 can sense the position, velocity, acceleration, and/or any other desired parameter associated with the load 201. The sensor 203 can sense the position of the lens 2801 (see FIG. 28) of lens assembly 103 so as to facilitate focusing of the camera 101, for example.

The sensor 202 can provide an output representative of the sensed parameter to the controller 203. The controller 203 can use the output of the sensor 202 to facilitate focusing of the camera 101, for example.

The controller 203 can control a display 204. The display 204 can include any desired information. For example, the display 204 can show the scene being photographed, can indicate whether an autofocus function is on or off and/or can indicate what portion of a scene being photographed is being used as the target for autofocusing.

User controls 206 can affect operation of the actuator 102, via the controller 203. For example, a user can operate the user controls 206 to zoom, turn autofocus on or off, and/or turn image stabilization on or off.

A memory 205 can store programs for the controller 203 and/or can store other information. For example, the memory 205 can store images captured by the camera 101, parameters related to autofocus such as distance to the subject, and/or parameters for relating values sensed by the sensor 202 to positions of the lens 2801 (see FIG. 28).

Figure 3:
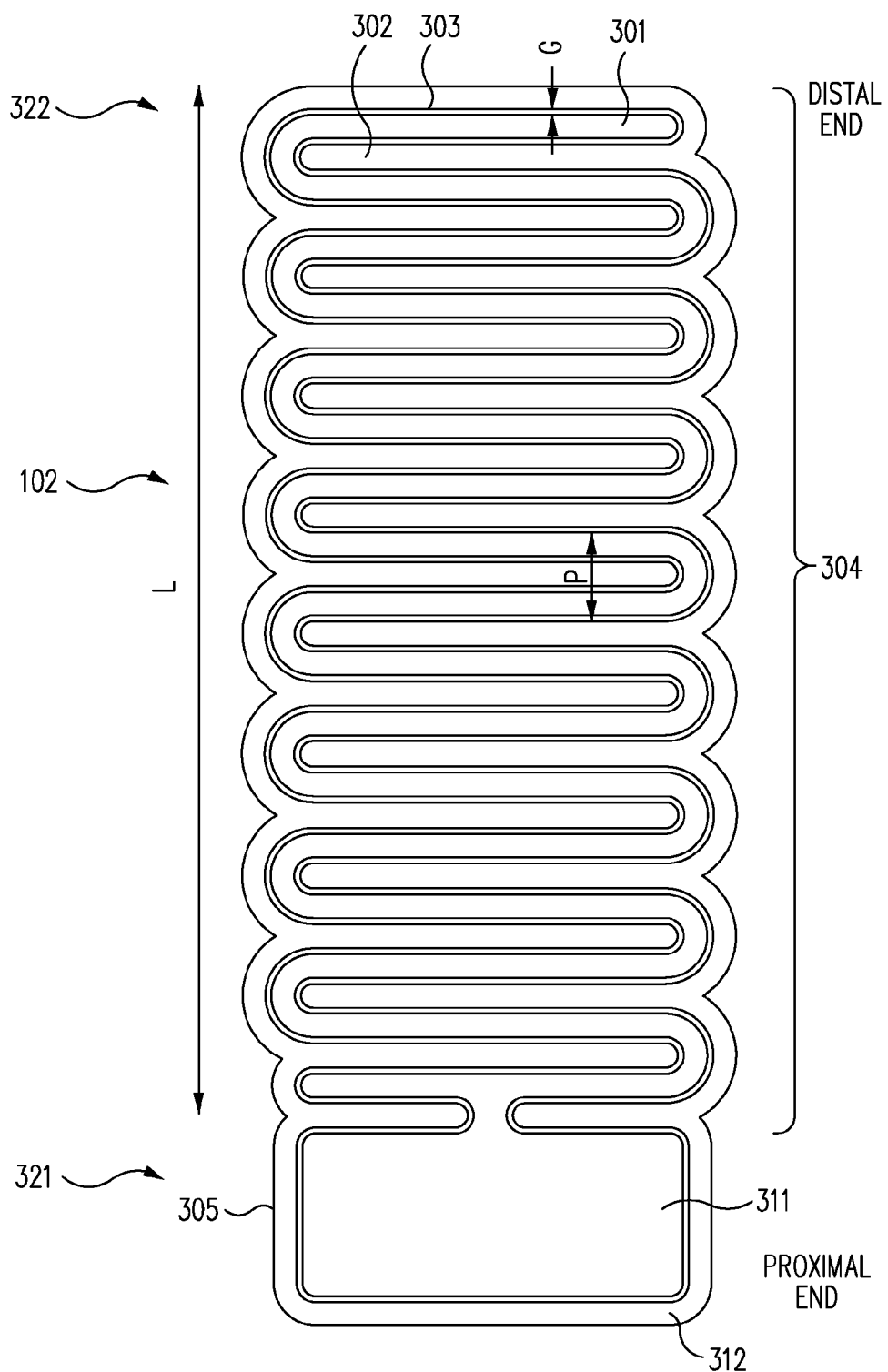
FIG. 3 shows a cascaded electrostatic actuator, in accordance with an embodiment.

FIG. 3 shows a cascaded electrostatic actuator 102, in accordance with an embodiment. The actuator 102 can comprise a plurality of first electrodes or first layers 301 and a plurality of second electrodes or second layers 302.

The first layers 301 can define a serpentine structure or flexure. The second layers 302 can define a interleaved structure or flexure that interleaves with respect to the serpentine structure. Thus, the first layers 301 and the second layer 302 can interleaved with respect to one another.

The first layers 301 and the second layers 302 can be in an alternating configuration, such that substantially every first layer 301 has a second layer 302 on each side thereof and visa versa. The first layers 301 and the second layers can cooperate to define a stack 304 having an unactuated (no voltage applied) height, Dimension L.

The first layers 301 can be formed of single crystalline silicon and the second layers 302 can be formed of polysilicon or visa versa. The first layers 301 and the second layers 302 can be formed of any other suitable material. The first layers 301 and the second layers 302 can both be formed of the same material.

A gap 303 can be formed between each first layer 301 and each second layer 302. The gap 303 can have a width, Dimension G. Each first layer 301 and second layer 302, along with the gap 303 therebetween, can have a height, Dimension P.

The actuator 102 can have any number of first layers 301 and second layers 302. Generally, the number of first layers 301 and second layers 302, along with the width of the gap 303, will at least partially determine the travel of the actuator 102. For example, the travel of the actuator 102 can be approximately the width, Dimension G, of the gap 303 multiplied by the number of gaps 303.

The first layers 301 can define a generally serpentine structure. The second layers 302 can interleave with respect to the first layers 301. The second layers 302 can substantially surround the first layers 301. The first layers 301 and/or the second layers 302 can have any desired shapes. Different shapes can be used, for example, to provide different stiffnesses and thus different responses to an applied voltage, as discussed herein.

A base 305 at one end of the stack 304 can define a proximal end 321 of the actuator 102. The opposite end of the stack 304 can define a distal end 322 of the actuator 102. The base 305 can be attached to one structure and the distal end 322 of the stack 304 can be attached to another structure such that actuation of the actuator effects relative movement of the two structures.

For example, the base 305 can be attached to a stationary portion (such as the lens barrel 2803 of FIG. 28) of the lens assembly 103 and the distal end 322 of the stack 304 can be attached to the lens 2801 (see FIG. 28) to effect movement of the lens 2801 for the focusing of the camera 101. The base 305 can also facilitate electrical connection to the actuator 102, as discussed herein.

Electrical contract to the actuator 102 can be made in any desired manner. For example, electrical contact can be made to a pad 311 formed of single crystalline silicon which can be in electrical communication with the first layers 301 and electrical contact can be made to the surrounding structure 312 formed of polysilicon which can be in electrical communication with the second layers 302.

Actuation of the actuator 102 can result in a snap-in motion thereof due to the electrostatic force between the first layers 301 and the second layers 302. During the snap-in motion, the distal end of the stack 304 moves quickly or snaps from its distal most or unactuated position to its proximal most or actuated position. During the snap-in motion, substantially all of the adjacent pairs of the first layers 301 and the second layers 302 move substantially simultaneously toward one another such that the stack 304 rapidly contracts in length, Dimension L.

When unactuated, the stack 304 is expanded (has approximately the longest length, Dimension L, thereof). When actuated, the stack 304 is contracted (has approximately the shortest length, Dimension L, thereof).

Rather than all or nothing snap-in movement of the stack 304 as a whole, separate snap-in movement of separate portions or segments of the stack 304 can be provided. In this manner, more gradual, controlled movement of the actuator 102 can be provided. Incremental or partial actuation of the actuator 102 can be provided in this manner. Generally continuous actuation of the actuator 102 can be provided in this manner.

For example, the different segments of the stack 304 can have different stiffness, such that the different segments of the stack 304 snap-in at different voltages. Thus, as the voltage is increased, different segments of the stack 304 snap-in and the length of the stack 304 changes more gradually.

Different stiffnesses of the different segments of the stack 304 can be provided by fabricating the first layers 301 and/or the second layers 302 so as to have different widths within the different segments. Different stiffnesses of the different segments of the stack 304 can be provided by fabricating the first layers 301 and/or the second layers 302 so as to have different shapes within the different segments.

Different widths, Dimension G, of the gap 303 can be used to provide different forces between adjacent ones of the first layers 301 and the second layers 302 such that different pairs of the first layers 301 and the second layers 302 snap in at different times (upon the application of different voltages). In this manner, smoother operation of the actuator 102 can be provided.

The motion of the actuator 102 need not be snap-in, either as a whole or for segments thereof. For example, the stiffness of the stack 304 can be substantially continuously non-linear such that the motion of the actuator 102 is substantially continuous. Thus, the distal end of the stack 304 can move generally continuously as the voltage applied to the actuator 102 is increased.

The position or state of the actuator 102 (such as the position of the distal end 322 of the stack 304) can be determined by measuring the capacitance of the actuator 102. That is, the capacitance between the first layers 301 and the second layers 302 can provide an indication of whether or not the actuator 102 is actuated and can provide an indication of the degree of actuation. The position of an portion of the actuator 102 can be determined by measuring the capacitance of that portion.

The actuator 102 can be fabricated by etching a trench in a single crystalline substrate. The unetched portions of the substrate can define the second layers 302. The trench can be filled with polysilicon to define the first layers 301. An oxide layer can be formed to electrically isolate the first layers 301 from the second layers 302 during operation of the actuator 102. The fabrication process is described in further detail herein.

Figure 4:
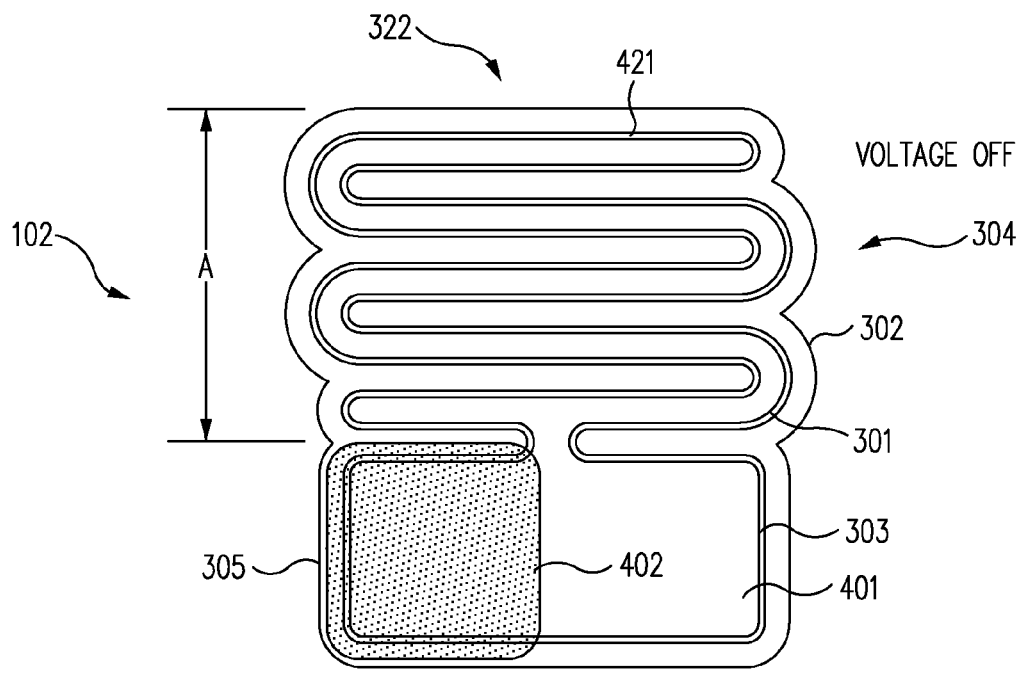
FIG. 4 shows a cascaded electrostatic actuator in an unactuated state (with a voltage off), in accordance with an embodiment.
Figure 5:
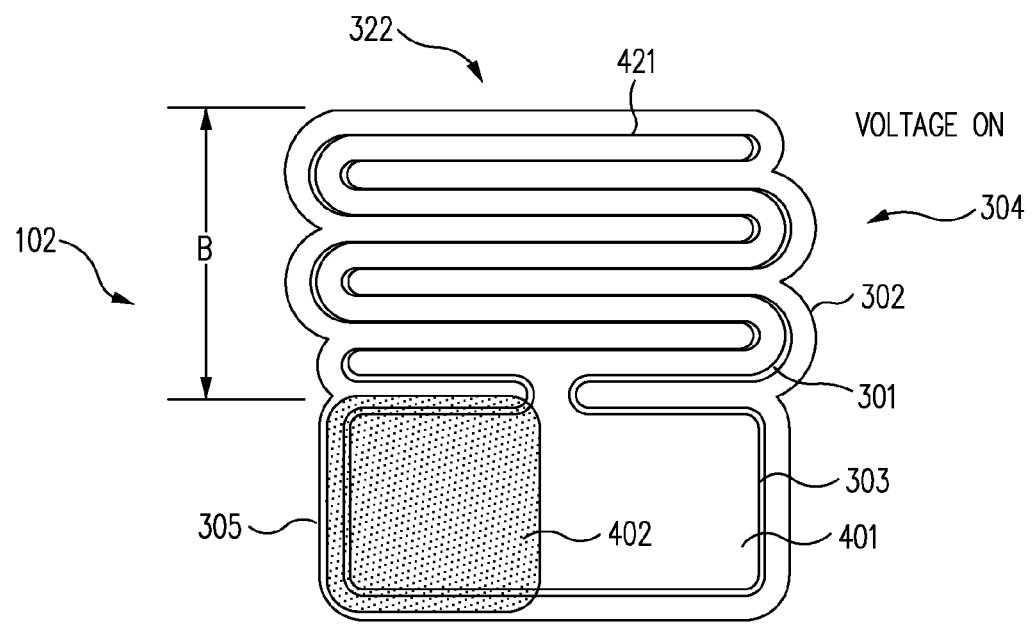
FIG. 5 shows a cascaded electrostatic actuator in an actuated state (with a voltage on), in accordance with an embodiment.

Operation of the cascaded electrostatic actuator 102 is discussed with reference to FIGS. 4 and 5. FIG. 4 shows the actuator 102 in an unactuated state (with a voltage off), in accordance with an embodiment. FIG. 5 shows the actuator 102 in an actuated state (with a voltage on), in accordance with an embodiment.

With particular reference to FIG. 4, when no voltage is applied to the actuator 102, then the charges on the first layers 301 and the second layers 302 are approximately the same. That is, the first layers 301 and the second layers 302 are at approximately the same electrical potential. Thus, there is no substantial force exerted between the first layers 301 and the second layers 302. Since there is no substantial force exerted, the actuator 102 remains in an unactuated state.

With particular reference to FIG. 5, when a voltage is applied to the actuator 102, then the charges on the first layers 301 and the second layers 302 are substantially different with respect to one another. That is, the first layers 301 and the second layers 302 are at substantially different electrical potentials.

Thus, there is a substantial attractive force exerted between the first layers 301 and the second layers. Since there is a substantial force exerted, the actuator 102 moves or snaps in to an actuated state. In the actuated state, the stack 304 is compressed or contracted with respect to the unactuated state.

When the stack 304 is contracted, adjacent first layers 301 and second layers 302 can contact one another. An insulator, such as an oxide layer 421 can be formed upon one or both of the first layers 301 and second layers 302 to inhibit shorting or electrical contact therebetween.

The height, Dimension A, of the stack 304 of the unactuated actuator 102 of FIG. 4 is substantially greater than the height, Dimension B, of the stack 304 of the actuated actuator 102 of FIG. 5. Thus, during actuation, the distal end 322 of the stack 304 moves toward the base 305 of the actuator 102.

The amount of such movement can be approximately equal to the sum of the gaps 303 of the stack 304. Thus, the amount of such movement can be greater than the width of a single gap 303.

An advantage of this cascaded configuration of the actuator 102 can be that more travel can be obtained by making the stack 304 thereof longer. That is, as more first layers 301 and second layers 302 (and consequently more gaps 303) are used, the total amount of travel of the distal end 322 of the stack 304 obtained when the actuator 102 is actuated is proportionally increased.

Another advantage of this cascaded configuration of the actuator 102 can be that more force can be provided. The electrostatic force provided by such an actuator is proportional to the area of the first layers 301 and the second layers 302. Thus, increased force can be obtained by making the thickness, Dimension T of FIG. 8 and/or the width, Dimension W of FIG. 8, greater.

Substantial forces can be provided by the cascaded configuration. For example, a 1 mm wide, 150 µm thick actuator 102 can produce approximately 10 grams of force.

A first electrical contact 401 and a second electrical contact 402 can be formed from or upon the base 305. For example, the first electrical contact 401 can be formed from the material of the first layers 301, e.g., single crystalline silicon, and the second electrical contact 402 can be formed from the material of the second layers, e.g., polysilicon.

The first electrical contact 401 can be formed along with the first layers 301 during the fabrication process and can thus be in electrical contact with the first layers 301. The second electrical contact 402 can be formed upon the base 305 after the first layer 301 and the second layers 302 have been fabricated, as discussed herein. The second electrical contact 402 can be electrically insulated from the base 305, such as via an oxide layer (not shown) formed therebetween. The second electrical contact 402 can be in electrical contact with the second layers 302, such as where the second electrical contact 402 is formed thereover.

Electrical connection can be made to the first electrical contact 401 and the second electrical contact 402 in the manner that electrical connection is commonly made to the pads or electrical contacts of integrated circuits. For example, such electrical connection can be made via wire bonding.

Figure 6:
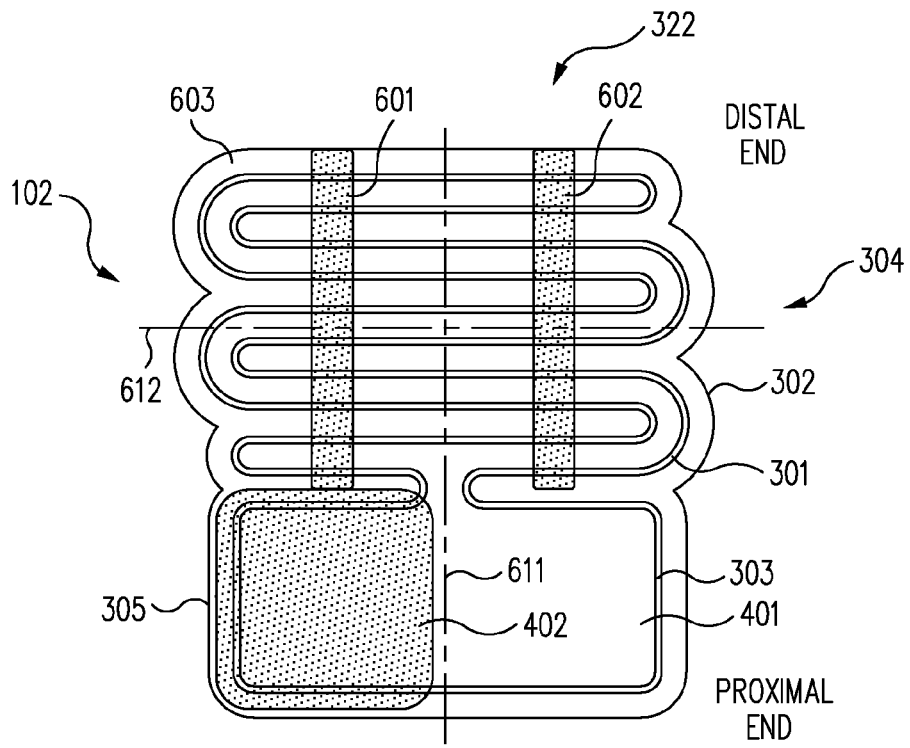
FIG. 6 shows a cascaded electrostatic actuator having two polysilicon hinges, in accordance with an embodiment.

FIG. 6 shows a cascaded electrostatic actuator 102 having a first polysilicon hinge 601 and a second polysilicon hinge 602, in accordance with an embodiment. The first polysilicon hinge 601 and the second polysilicon hinge 602 cooperate to cause the distal end 322 of the stack 304 to flex or bend downwardly, out of the plane of the actuator 102 during actuation. In this manner, a more complex, non-linear motion can be obtained.

The motion of the distal end of the stack 304 can depend, at least partially, upon the stiffness of the first polysilicon hinge 601 and the second polysilicon hinge 602. The stiffness of the first polysilicon hinge 601 and the second polysilicon hinge 602 can depend upon the width and thickness (e.g., the cross-sectional area) thereof.

The motion of the distal end of the stack 304 can have both translational (linear) and rotational (non-linear) components. Generally, the stiffer the first polysilicon hinge 601 and the second polysilicon hinge 602, the less the translational component will be and the greater the rotational component will be. The first polysilicon hinge 601 and the second polysilicon hinge 602 can have different stiffnesses, such that more complex motion of the distal end of the stack 304 can be provided.

The first polysilicon hinge 601 and the second polysilicon hinge 602 inhibit or prevent the upper surface 603 of the stack 304 from contracting when the actuator 102 is actuated. As the lower surface of the actuator contracts, generally along the centerline or movement axis 611, the distal end of the stack 304 curls down along an arc, approximately about an axis 612.

Thus, the distal end of the stack 304 can have a rotational component, and can have some linear component as well (depending upon the stiffness of the first polysilicon hinge 601 and the second polysilicon hinge 602). Such motion can be desirable in those instances where linear motion is inadequate. The use of an actuator that directly provides motion with such a rotational component has the advantage of not requiring additional structure to convert the motion from a linear actuator into a desired non-linear motion.

Figure 7:
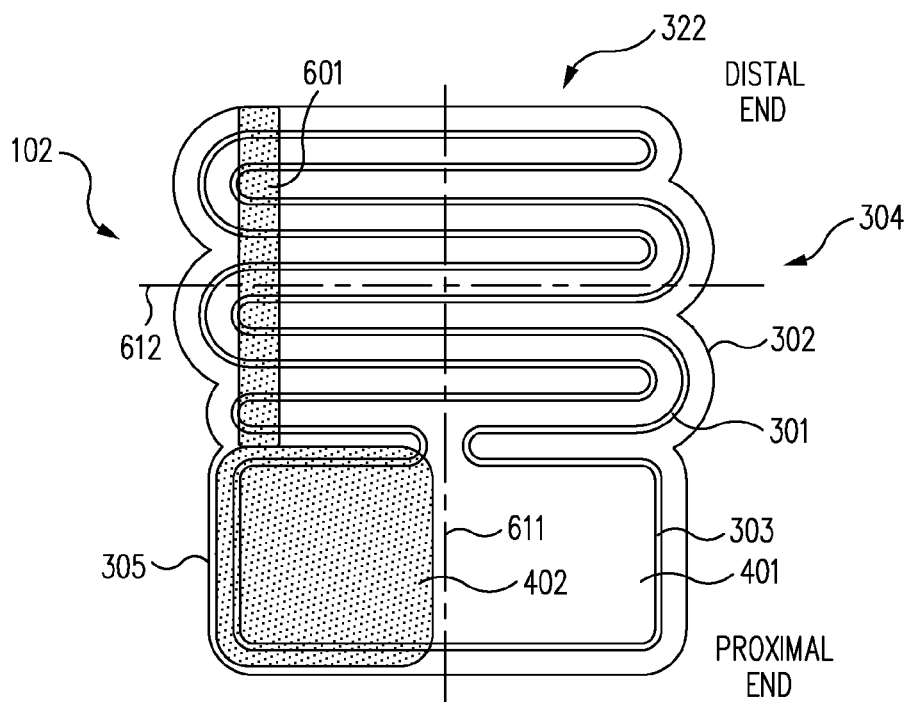
FIG. 7 shows a cascaded electrostatic actuator having one polysilicon hinge, in accordance with an embodiment.

FIG. 7 shows a cascaded electrostatic actuator having one polysilicon hinge, i.e., the first 601 polysilicon hinge, in accordance with an embodiment. The first polysilicon hinge 601 can cause the distal end of the stack 304 to flex or bend downwardly, out of the plane of the actuator 102, and to twist at the same time. Such twisting can result in some lateral movement of the distal end of the stack 304. In this manner, a more complex, non-linear motion can be obtained.

The motion of the distal end of the stack 304 can depend, at least partially, upon the stiffness of the first polysilicon hinge 601. The stiffness of the first polysilicon hinge 601 can depend upon the width and thickness (e.g., the cross-sectional area) thereof.

The motion of the distal end of the stack 304 can have both translational (linear) and rotational (non-linear) components. The rotational components can be about two or more separate axes. Generally, the stiffer the first polysilicon hinge 601, the less the translational component will be and the greater the rotational components will be.

The use of only the first polysilicon hinge 601 adds stiffness to the stack 304 asymmetrically. Such asymmetric stiffness result in the more complex bending and twisting motion of the stack 304 during actuation and deactuation.

The first polysilicon hinge 601 can inhibit or prevent the one side (the left side as shown in FIG. 7) of the upper surface 603 of the stack 304 from contracting when the actuator 102 is actuated. As the lower surface and right side of the actuator contract generally along the centerline or movement axis 611, the distal end of the stack 304 curls down along an arc, such as about axis 612, and also twists, such as about a centerline or axis 611.

Thus, the distal end 322 of the stack 304 can have two rotational components (bending and twisting), and can have some linear component as well (depending upon the stiffness of the first polysilicon hinge 601 and/or the second polysilicon hinge 602. Such motion can be desirable in those instances where linear motion is inadequate. The use of an actuator that directly provides motion with such a rotational component has the advantage of not requiring additional structure to convert the motion from a linear actuator into a desired non-linear motion.

Figure 8:
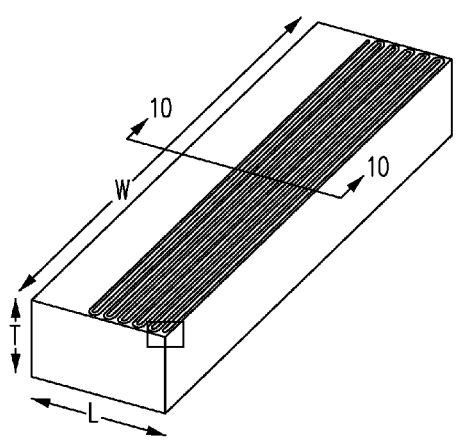
FIG. 8 shows a stack of a cascaded electrostatic actuator, in accordance with an embodiment.

FIG. 8 shows the stack 304 (or a portion of the stack 304) in perspective, in accordance with an embodiment. The stack 304 can have a thickness, Dimension T; a width, Dimension W; and a length, Dimension L. The stack 304 is made up of the first layers 301 and the second layers 302. Consequently, each of the first layers 301 and the second layers have approximately the same thickness, Dimension T and approximately the same width, Dimension W.

Each of the first layers 301 has at least one surface that faces or opposes a corresponding surface of one of the second layers 302, and visa versa. The area of these opposing surfaces, in part, determines the electrostatic force generated between the first layers 301 and the second layers 302. Generally, the greater this area is, the greater the electrostatic force is between opposing first layers 301 and second layers 302.

Figure 9:
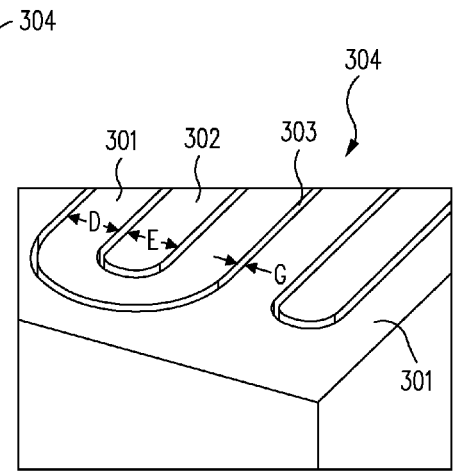
FIG. 9 shows an enlarged portion of the stack of FIG. 8, in accordance with an embodiment.

FIG. 9 shows an enlarged portion of the stack 304 of FIG. 8, in accordance with an embodiment. The first layers 301 can have a thickness, Dimension D, which can be approximately 6 μm, for example. The second layers 302 can have a thickness, Dimension E, which can be approximately 6 μm, for example. The thickness, Dimension D, of the first layers 301 can be the same as the thickness, Dimension E, of the second layers 302. The thickness, Dimension D, of the first layers 301 can be different with respect to the thickness, Dimension E, of the second layers 302.

All of the first layers 301 can have the same thickness, Dimension D, as one another. The first layers 301 can have different thicknesses, Dimension D, with respect to one another.

All of the second layers 302 can have the same thickness, Dimension D, as one another. The second layers 302 can have different thicknesses, Dimension D, with respect to one another.

The gap 303 can have a thickness, Dimension G, which can be approximately 1 μm, for example. The widths of the gaps 303, Dimension G, in part, determine the electrostatic force generated between the first layers 301 and the second layers 302. Generally, the smaller the gap 303 is, the greater the electrostatic force is between opposing first layers 301 and second layers 302.

The widths of the gaps, Dimension G, can all be the same. The widths of the gaps, Dimension G, can be different with respect to one another.

Figure 10:
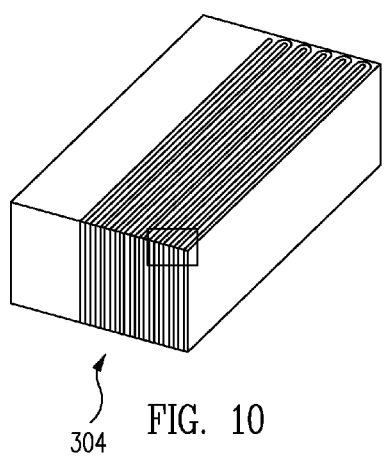
FIG. 10 shows a portion of the stack of FIG. 8, in accordance with an embodiment.

FIG. 10 shows a cross-section of the stack 304 taken alone line 10 of FIG. 8, in accordance with an embodiment. The relationships between the first layers 301, the second layers 302, and the gaps 303 can clearly be seen.

Figure 11:
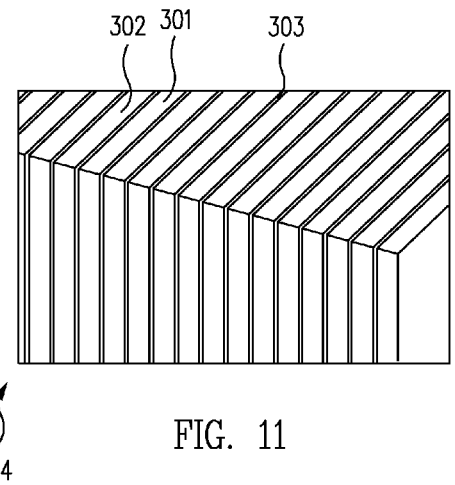
FIG. 11 shows an enlarged portion of the stack of FIG. 10, in accordance with an embodiment.

FIG. 11 shows an enlarged portion of the stack 304 of FIG. 10, in accordance with an embodiment. The gap 303 can be an air gap. Alternatively, the gap 303 can be filled or partially filled with a readily compressible material. For example, the gap 303 can contain a substantial vacuum or an inert gas.

When a voltage is applied to the first layers 301 and the second layers 302, an electrostatic force is generated therebetween. This electrostatic force is attractive since voltages of different polarities result in attraction. This attractive force tends to cause the stack 304 to collapse or contract. As the stack 304 contracts, the width, Dimension G, of the gap 303 is reduced.

The width, Dimension G, of the gap 303 can be reduced to substantially zero, at which point the adjacent first layers 301 and second layers 302 can contact one another. As discussed herein, a oxide layer can be formed upon the first layers 301 and/or the second layers 302 to prevent shorting of the charges thereon.

According to an embodiment, when the voltage applied to the actuator 102 is sufficient, the first layers 301 and the second layers 302 of the stack 304 can all contract simultaneously, as a unit. Such contracting of the stack 304 as a unit can result in snap-in actuation, as discussed herein.

According to an embodiment, as different, e.g., higher, voltages are applied to the actuator 102, different pairs of the first layers 301 and the second layers 302 can contract at different times. Such serial contracting of the stack 304 can provide a more controlled use of the actuator 102, as discussed herein.

Figure 12:
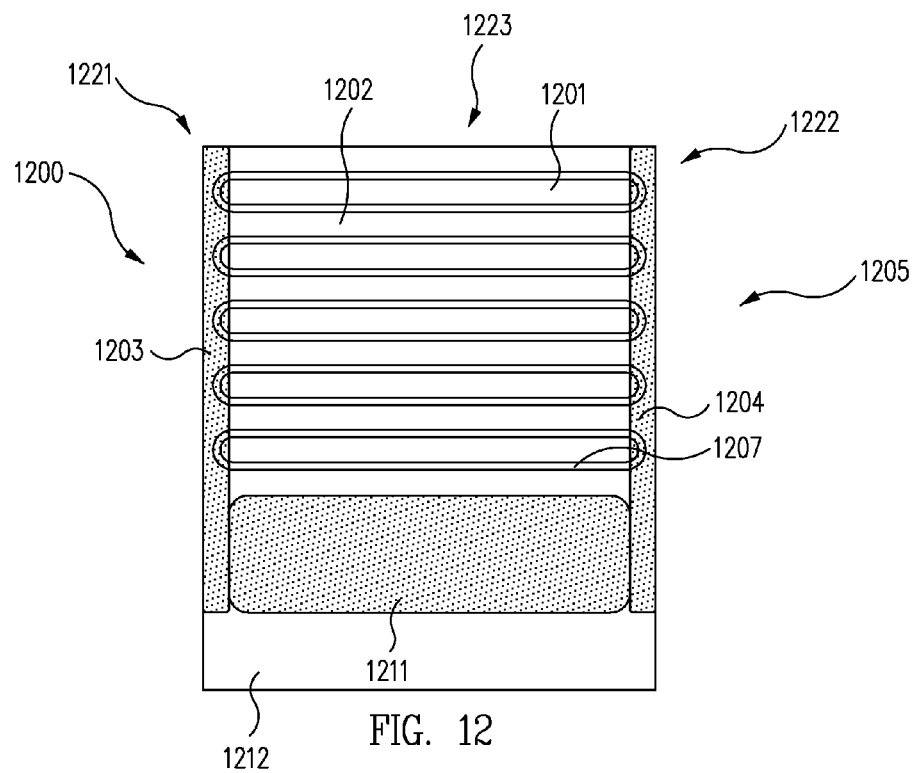
FIG. 12 shows a cascaded electrostatic actuator, in accordance with an embodiment.

FIG. 12 shows a cascaded electrostatic actuator 1200, in accordance with an embodiment. According to this embodiment, a plurality of first or inner layers 1201 and a plurality of second or outer layers 1202 define a plurality of cells 1400 (see FIG. 14), wherein the inner layers 1201 are substantially enclosed within the outer layers 1202, as discussed below. The inner layers 1201 are separated from the outer layers 1202 by a gap 1207.

The inner layers 1201 and the outer layers 1202 can be supported by surface polysilicon flexures, such as a first surface flexure 1203 and a second surface flexure 1204. The first surface flexure 1203 and the second surface flexure 1204 can secure the inner layers 1201 and the outer layers 1202 to one another so as to inhibit relative motion therebetween.

In this manner, less-contracting or non-contracting portions of the electrostatic actuator 1200 can be defined. That is, the first surface flexure 1203 and the second surface flexure 1204 can inhibit or prevent the stack 1205 from contracting along edges 1221 and 1222 thereof while allowing the stack 1205 to contract in a central portion 1223 thereof.

Electrical contract to the actuator 1200 can be made via a pad or electrical connection 1211 formed of polysilicon which can be in electrical communication with the inner layers 1201 and which can be electrically isolated from the outer layers 1202.

Electrical contact actuator 1200 can be made via a substrate or electrical connection 1212 formed of single crystalline silicon which can be in electrical communication with the outer layers 1202 and which can be electrically isolated from the inner layers 1201.

Figure 13:
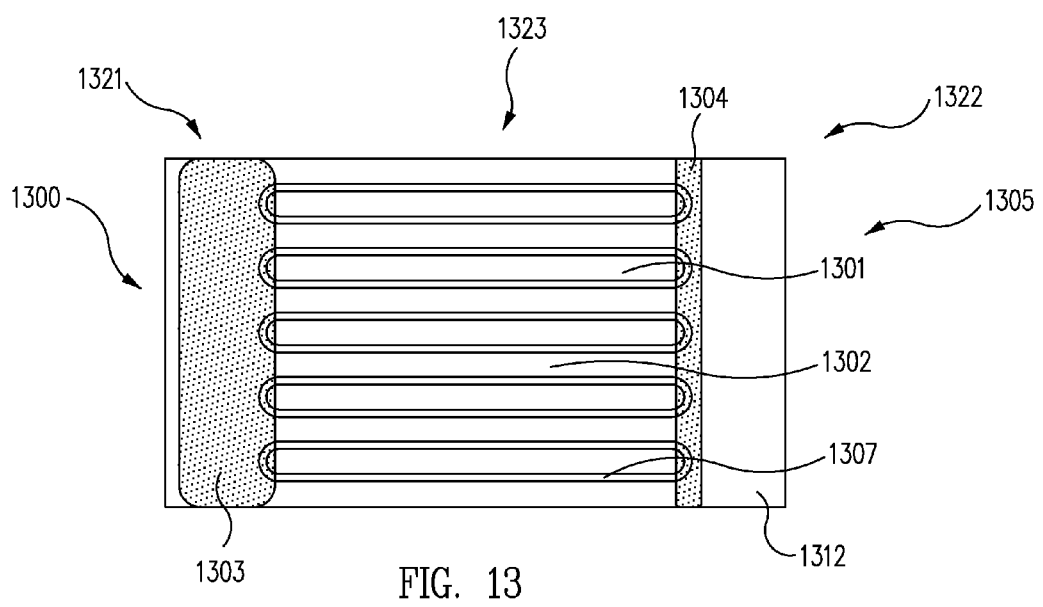
FIG. 13 shows a cascaded electrostatic actuator, in accordance with an embodiment.

FIG. 13 shows a cascaded electrostatic actuator 1300, in accordance with an embodiment. According to this embodiment, a plurality of first or inner layers 1301 and a plurality of second or outer layers 1302 define a plurality of cells 1400 (see FIG. 14), wherein the inner layers 1301 are substantially enclosed within the outer layers 1302. The inner layers 1301 are separated from the outer layers 1302 by a gap 1307.

The inner layers 1301 and the outer layers 1302 can be supported by surface polysilicon flexures, such as a first surface flexure 1303 and a second surface flexure 1304. The first surface flexure 1303 and the second surface flexure 1304 can secure the inner layers 1301 and the outer layers 1302 to one another so as to inhibit relative motion therebetween.

In this manner, non-contractable portions of a stack 1305 can be defined. That is, the first surface flexure 1303 and the second surface flexure 1304 can inhibit or prevent the stack 1305 from contracting along edges 1321 and 1322 thereof while allowing the stack 1305 to collapse in a central portion 1323 thereof.

Electrical contract to the actuator 1300 can be made via the first surface flexure 1303 formed of polysilicon, which can be in electrical communication with the inner layers 1301 and which can be electrically isolated from the outer layers 1302.

Electrical contact can be made to the substrate or electrical connection 1312 formed of single crystalline silicon, which can be in electrical communication with the outer layers 1302 and which can be electrically isolated from the inner layers 1301.

Figure 14:
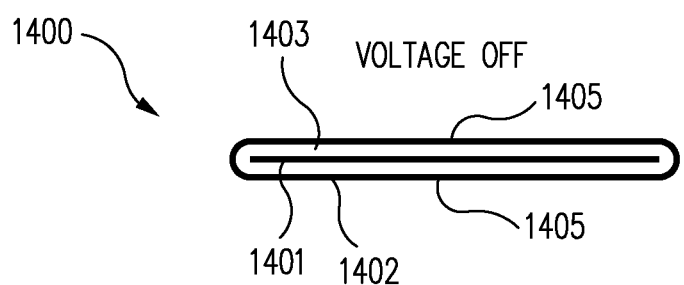
FIG. 14 shows a single cell of a cascaded electrostatic actuator in an unactuated state (with a voltage off), in accordance with an embodiment.
Figure 15:
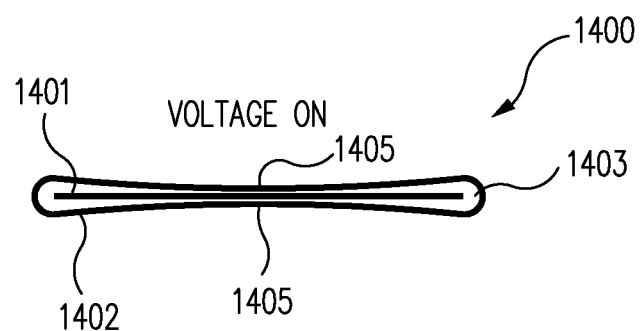
FIG. 15 shows a single cell of a cascaded electrostatic actuator in an actuated state (with a voltage on), in accordance with an embodiment.

FIGS. 14 and 15 show a single cell 1400, such as from the cascaded electrostatic actuators for FIGS. 12, 13, 16, and 17. Each of the cells 1400 of the actuators of FIGS. 12, 13, 16, and 17, for example, can have an unactuated configuration and an actuated configuration, as discussed below.

Each cell can be approximately 200 μm long by approximately 20 μm wide, for example. Each cell can have any desired dimensions.

Each cell can be generally oval or elongated in shape. Each cell can have any desired shape.

With particular reference to FIG. 14, a single cell 1400 of an actuator is in an unactuated state (with a voltage off), in accordance with an embodiment. The single cell 1400 can comprise a flexure, an inner electrode, or an inner layer 1401 (which can correspond to the inner layers 1201 of FIG. 12 or the inner layers 1301 of FIG. 13, for example). The single cell 1400 can comprise a flexure, a pair of outer electrodes, or outer layers 1402 (which can correspond to the outer layers 1202 of FIG. 12 or the outer layers 1302 of FIG. 13, for example).

A gap 1403 can be formed between the inner layer 1401 and the outer layer 1402. In the unactuated state, the gap 1403 can have a substantially uniform width therealong. Central portions 1405 of the outer layer 1402 are separated from the inner layer 1401 by the width of the gap 1403.

With particular reference to FIG. 15 a single cell 1400 of a cascaded electrostatic actuator is in an actuated state (with a voltage on), in accordance with an embodiment. In the actuated state, the cell 1400 has contracted such that central portions 1405 of the outer layer 1402 are closer to, e.g. touching or almost touching, the inner layer 1401. The inner layer 1401 and/or the outer layer 1402 can have an insulator, e.g., an oxide layer (not shown) formed thereon to electrically insulate the inner layer 1401 from the outer layer 1402 and thus prevent shorting of the electrostatic actuator.

Figure 16:
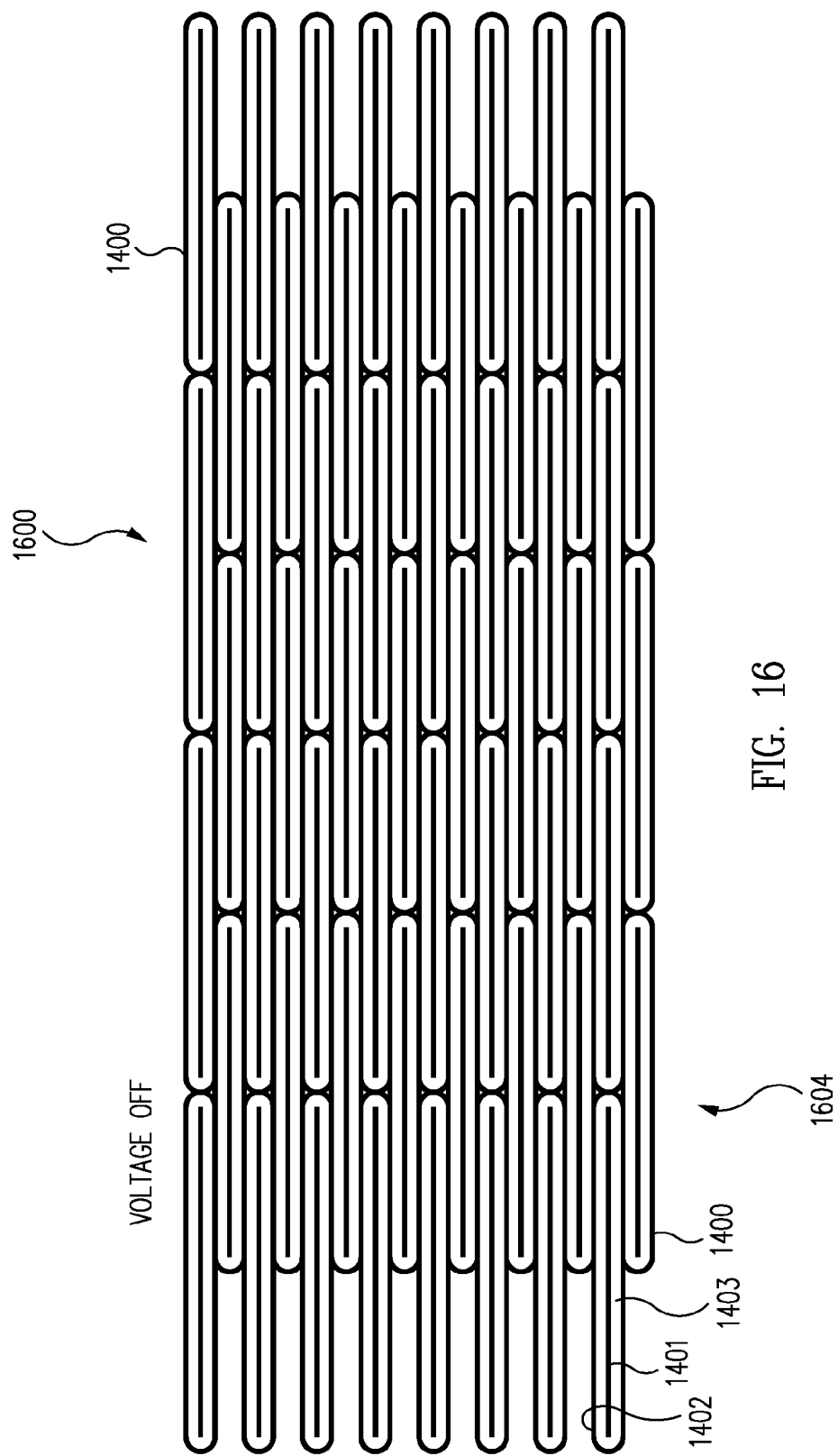
FIG. 16 shows a plurality of staggered cells of a cascaded electrostatic actuator in an unactuated state (with a voltage off), in accordance with an embodiment.
Figure 17:
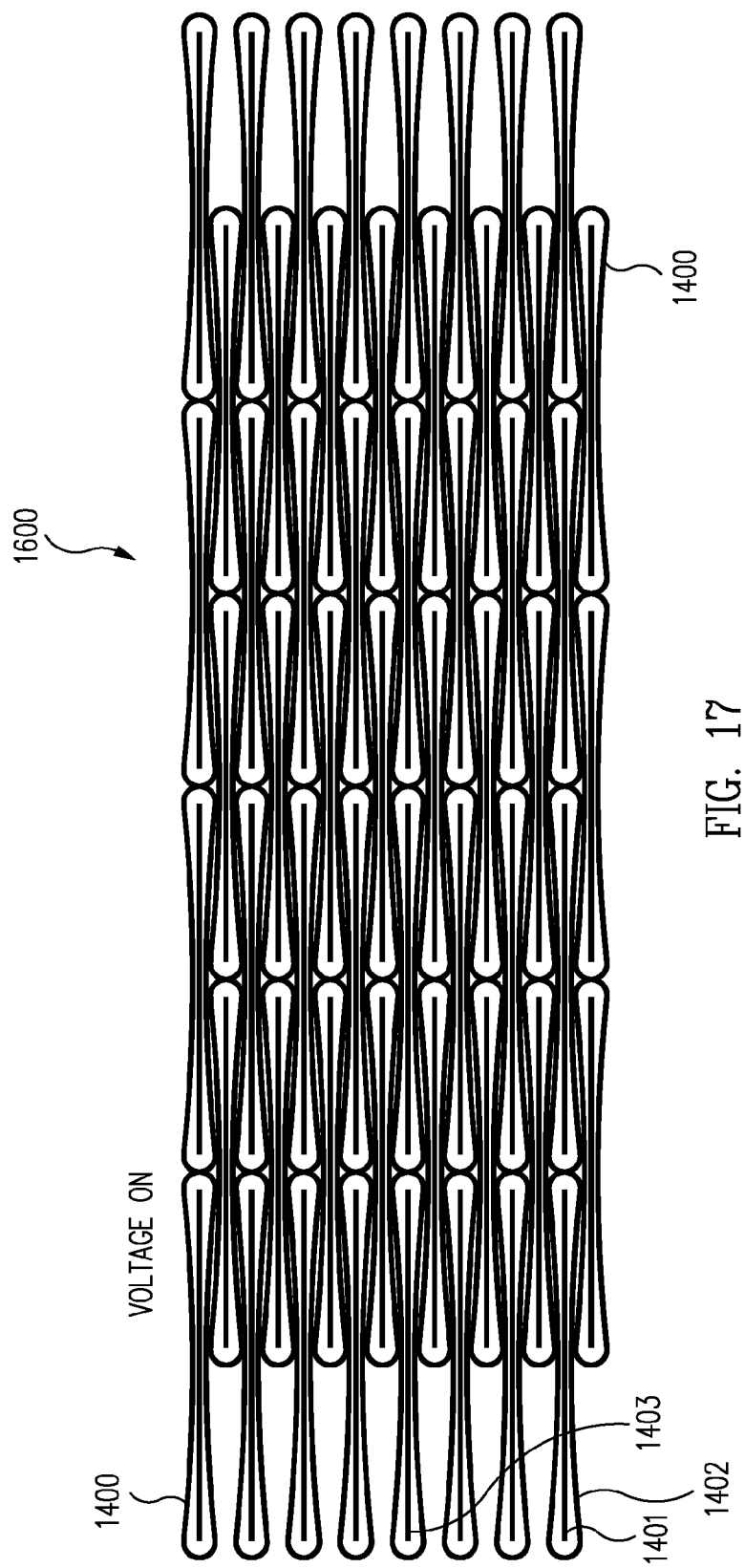
FIG. 17 shows a plurality of staggered cells of a cascaded electrostatic actuator in an actuated state (with a voltage on), in accordance with an embodiment.

FIGS. 16 and 17 show a plurality of cells 1400 that are fabricated together so as to define a stack 1600 for a cascaded electrostatic actuator. Any desired number of cells 1400 in any desired configuration can be used to define the stack 1600. The stack 1600 can have any desired number of cells 1400 in a row and can have any desired width. The stack 1600 can have any desired number of cells 1400 in a column and can have any desired height.

FIG. 16 shows a plurality of cells 1400 of a stack 1600 of a cascaded electrostatic actuator in an unactuated state (with a voltage off), in accordance with an embodiment. The inner layers 1401 and the outer layers 1402 of each of the cells 1400 are substantially straight and parallel with respect to one another. Alternatively, the inner layers 1401 and the outer layers can be crooked and/or non-parallel with respect to one another.

The cells 1400 of the stack 1600 can be somewhat analogous to the cells of a muscle. Providing more cells can provide more travel and/or more force. Generally, providing more cells 1400 in each column will provide more travel and providing more cells 1400 in each row will provide more force.

The cells 1400, as shown in FIG. 16, are in a staggered configuration. That is, adjacent columns of cells 1400 overlap substantially with respect to one another. Alternatively, the cells 1400 can have a non-staggered configuration.

The cells 1400, as shown in FIG. 16, are in a staggered so as to have approximately 50% overlap. The cells 1400 can be staggered in a different fashion, so as to have any desired amount of overlap. For example, the cells 1400 can have 20% overlap, 25% overlap, 33.3% overlap, or any other amount of overlap.

The stack 1600 is at approximately its full height, e.g., is approximately fully extended. Since the voltage is off and no charge is being applied to the inner layers 1401 and the outer layers 1402, the stack has not contracted.

FIG. 17 shows a plurality of cells 1400 of a stack 1600 of a cascaded electrostatic actuator in an actuated state (with a voltage on), in accordance with an embodiment. The outer layer 1402 of each of the cells 1400 is substantially curved inwardly toward the inner layer 1401 (as better shown in FIG. 15). Each of the cells 1400 is fully contracted. The stack 1600 is at approximately its shortest height, e.g., is approximately fully contracted.

Although FIG. 17 shows all of the cells 1400 in an actuated or fully contracted state, some of the cells 1400 can alternatively remain in an unactuated state. In this manner, the height of the stack 1600 can be more precisely controlled. For example, every other row of the cells 1400 can be actuated to provide approximately one half of the total travel of the actuator.

Further, the stack can be made to curve by actuating some cells 1400 while not actuating other cells 1400. For example, the cells 1400 on the left side of the stack 1600 can be actuated while the cells 1400 on the right side of the stack 1600 are not actuated to cause the stack 1600 to bend to the left.

Figure 18:
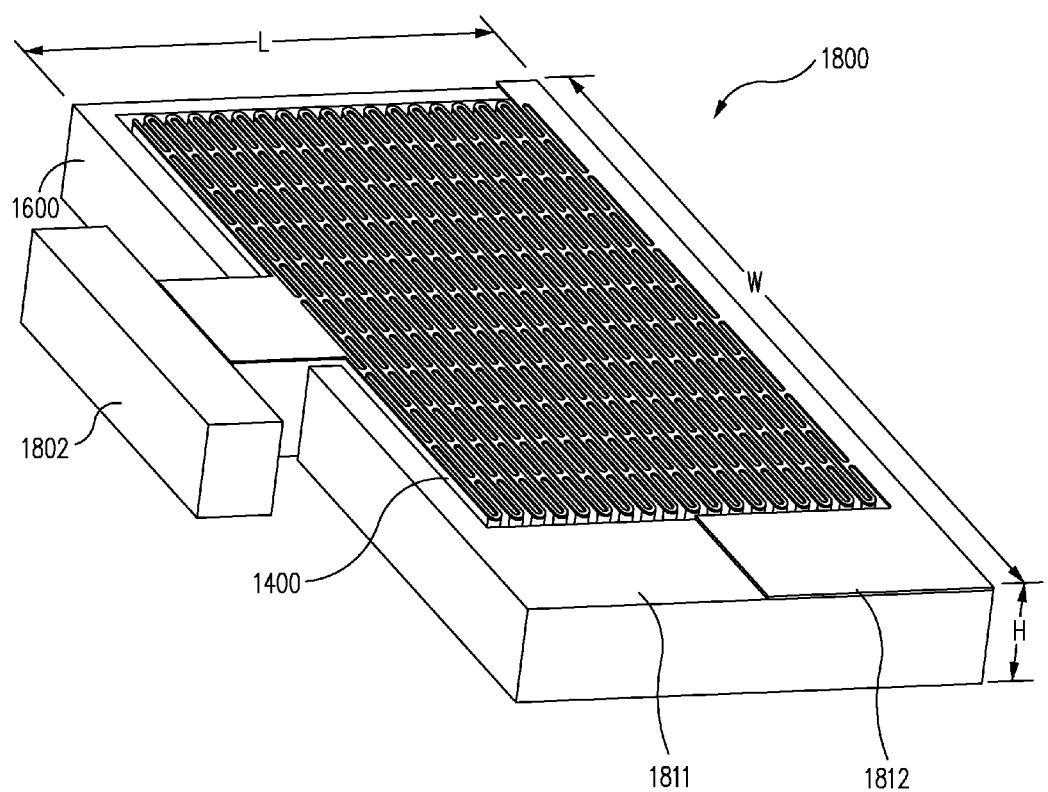
FIG. 18 shows a cascaded electrostatic actuator, in accordance with an embodiment.

FIG. 18 shows a cascaded electrostatic actuator 1800, in accordance with an embodiment. The actuator 1800 can have a substrate or body 1801 that generally substantially encircles a periphery of the stack 1600. The body 1801 can be formed of single crystalline silicon, for example. The body 1801 and the stack 1600 can be formed of monolithic single crystalline silicon, for example.

The stack 1600 can be attached the body 1801 and can be attached to an arm 1802 such that actuation of the actuator 1800 results in movement of the arm 1802 with respect to the body 1801. Thus, in various applications, the body 1801 can be attached to a non-moving (relative to the actuator 1800) structure and the arm 1802 can be attached to a moving structure so as to provide movement of the moving structure relative to the non-moving structure when the actuator 1800 is actuated.

For example, the body 1801 can be attached to a lens barrel of a camera and the arm 1802 can be attached to a shutter. In this manner, movement of the shutter can be provided when the actuator 1800 is actuated.

A single crystalline silicon electrical contact 1811 can be provided on the body 1901 and can be in electrical communication with the substrate or single crystalline silicon portions of the stack 1600. A polycrystalline silicon electrical contact 1812 can be provided on the body 1801 and can be in electrical communication with polycrystalline silicon portions of the stack 1600.

According to an embodiment, the actuator 1800 can be fabricated by etching a single crystalline wafer to form trenches that are approximately 180 µm deep to define the cells 1400. The wafer can be oxidized and the trenches then filled with polysilicon. Any surface polysilicon can then be patterned and etched. The wafer can be thinned to about 150 µm from the backside, so as to expose the trenches. The oxide can be etched in vapor hydrofluoric acid (HF) to release the actuator 1800. Metal can be applied to form any electrical contacts.

Each cell 1400 can be an elongated structure that is approximately 6 µm wide and approximately 200 µm long, for example. The inner layers 1401 can be separated from the outer layers 1401 by an air gap.

Figure 19:
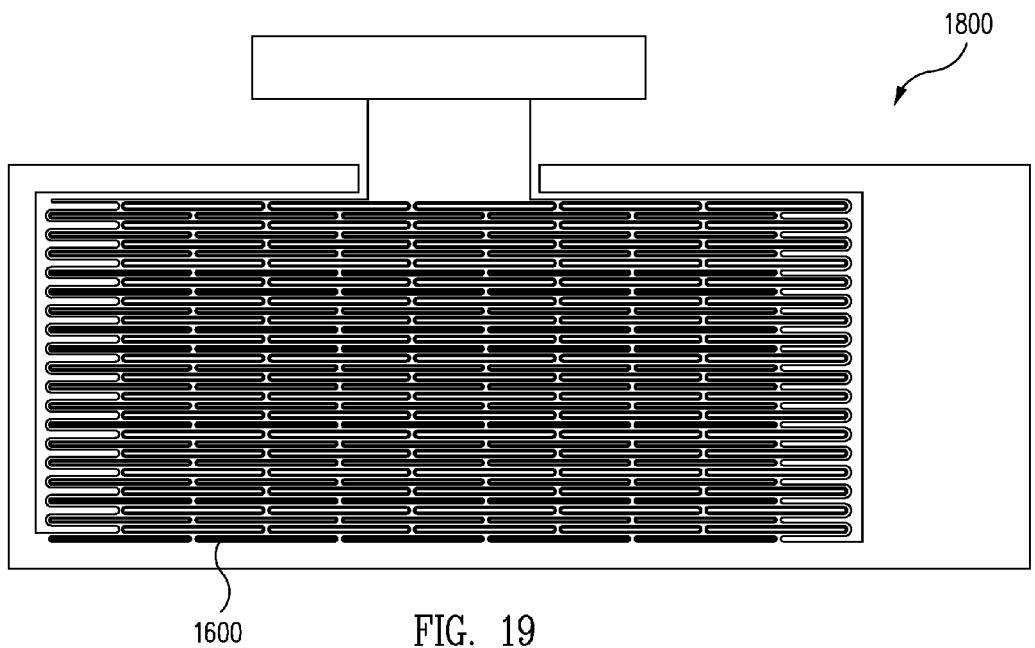
FIG. 19 shows a cascaded electrostatic actuator, in accordance with an embodiment.
Figure 20:
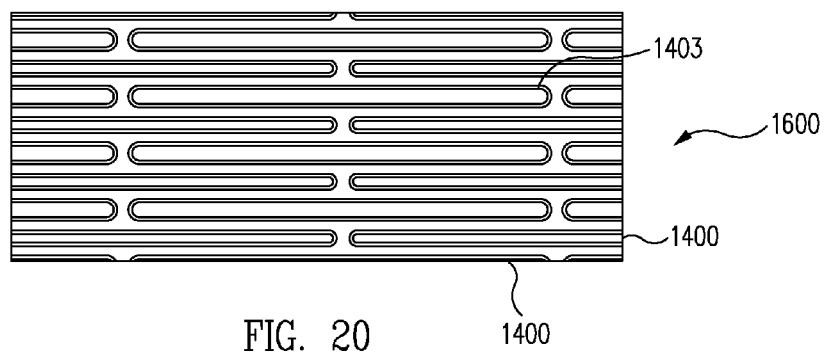
FIG. 20 shows an enlarged portion of the cascaded electrostatic actuator of FIG. 19, in accordance with an embodiment.

FIGS. 19 and 20 show a back side of the cascaded electrostatic actuator 1800, in accordance with an embodiment. The gap 1403 with each cell 1400 can be filled with air, for example.

Figure 21:
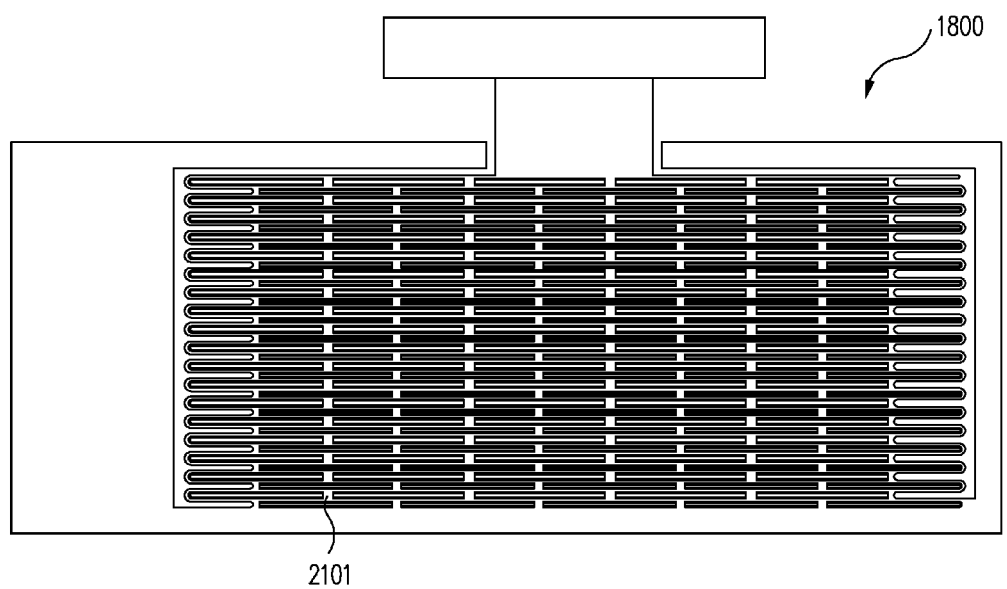
FIG. 21 shows a cascaded electrostatic actuator, in accordance with an embodiment.
Figure 22:
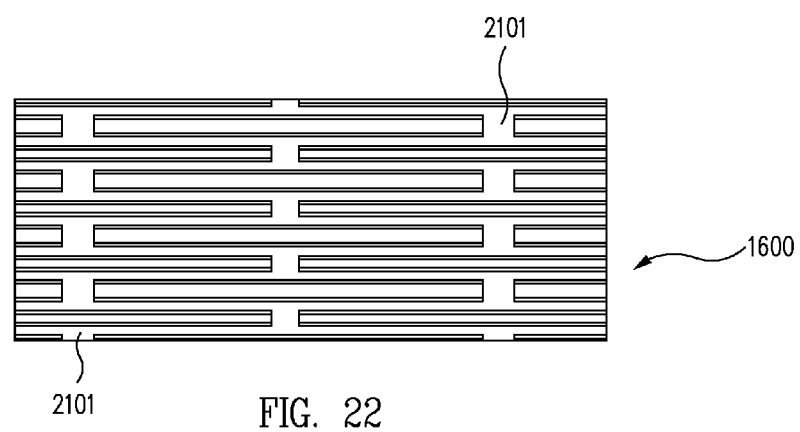
FIG. 22 shows an enlarged portion of the cascaded electrostatic actuator of FIG. 21, in accordance with an embodiment.

FIGS. 21 and 22 show a front side of a cascaded electrostatic actuator 1800, in accordance with an embodiment. The polysilicon inner layers 1401 can be held in place with a polysilicon film 2101 that extends thereacross.

Thus, for a given cell 1400 (see FIG. 14), the polysilicon film 2101 can extend from a first single crystalline silicon outer layer 1402, over the polysilicon inner layer 1401, and to a second single crystalline silicon outer layer 1402 in a manner that interconnects the first single crystalline outer layer 1402, the inner layer 1401, and the second outer layer 1402. Thus, a desired position of the inner layers 1401 can be maintained relative to the outer layers 1402.

An oxide layer can be formed between the polysilicon film 2101 and selected ones of the inner layers 1401 and/or the outer layers 1402. In this manner, current can be conducted to selected one of the inner layers 1401 and the outer layers 1402 to facilitate actuation of selected cells 1400.

The thickness of polysilicon film 2101 can, in part, determine the stiffness of the stack 1600. The polysilicon film 2101 can be approximately 3.5 µm thick, for example. The polysilicon film 2101 can have any desired thickness.

The polysilicon film 2101, or any portion thereof, can be electrically isolated from the inner layers 1401 and the outer layers 1402. Thus, the polysilicon film 2101 can define one or more conduits for routing current about the actuator 1800.

Figure 23:
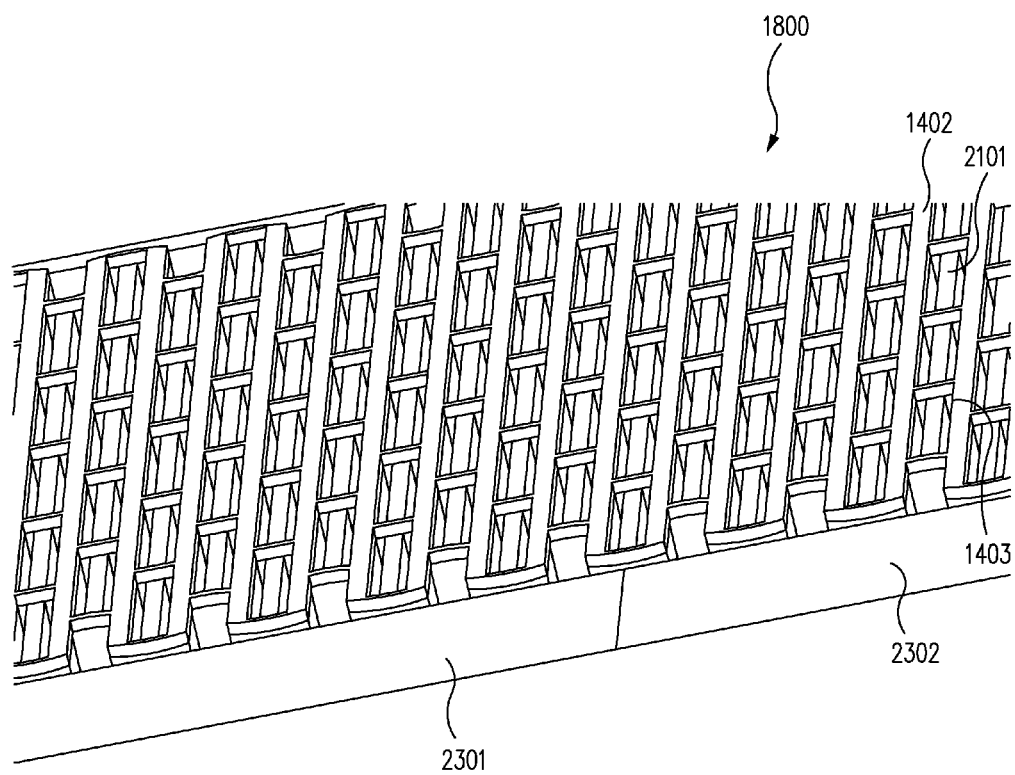
FIG. 23 shows a grazing view of a cascaded electrostatic actuator, in accordance with an embodiment.

FIG. 23 shows a grazing view of the cascaded electrostatic actuator 1800, in accordance with an embodiment. A single crystalline electrical contact 2301 provides electrical contact to the single crystalline outer layers 1402 and a polysilicon electrical contact 2302 provides electrical contact to the polysilicon inner layers 1402.

Figure 24:
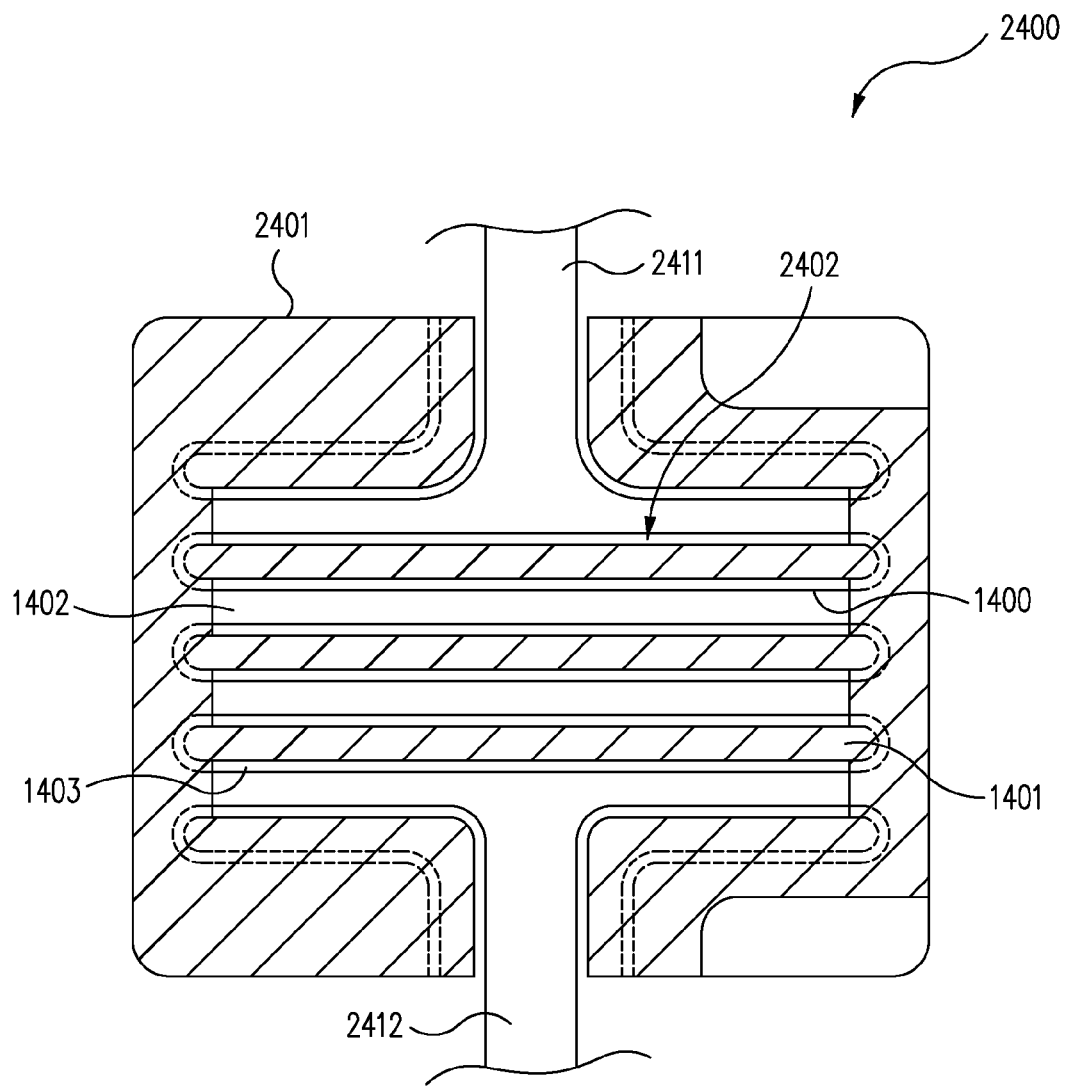
FIG. 24 shows a two sided cascaded electrostatic actuator, in accordance with an embodiment.

FIG. 24 shows a two sided cascaded electrostatic actuator 2400, in accordance with an embodiment. The two sided cascaded electrostatic actuator 2400 can have a substrate or housing 2401 that at least partially encloses a stack 2402 of cells 1400. A stack 2402 can comprise a single column of cells 1400 (as shown in FIG. 24) or can comprise a plurality of columns (such as the staggered columns of cell 1400 of FIG. 16).

The two sided cascaded electrostatic actuator 2400 can have two arms 2411 and 2412. One of the arms 2411, 2412 will extend further from the housing 2401 as the other of the arms 2412, 2411 is drawn into the housing 2401, when the actuator 2400 is actuated.

Thus, the two sided cascaded electrostatic actuator 2400 can be more easily used in broader range of applications than a comparable one sided cascaded electrostatic actuator. For example, the two sided cascaded electrostatic actuator 2400 can be more easily used in applications where a simultaneous push and pull are desired. Further, a single part, i.e., the two sided cascaded electrostatic actuator 2400, can be inventoried for use in either push or pull applications.

Figure 25:
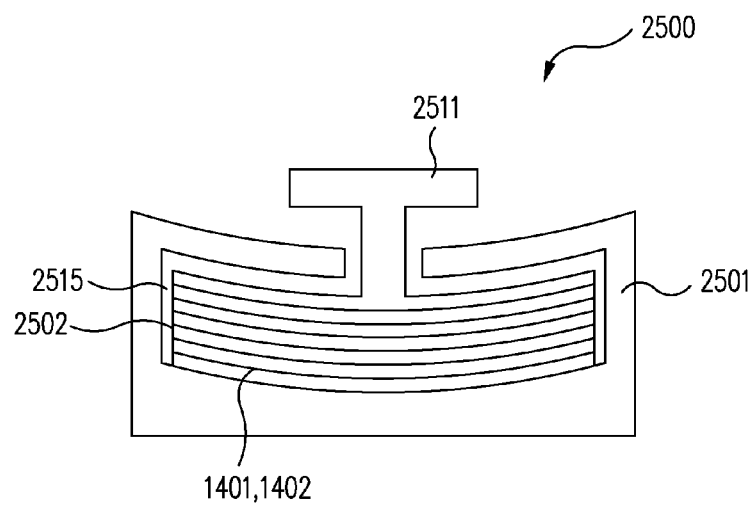
FIG. 25 shows a cascaded electrostatic actuator having curved inner and outer layers, in accordance with an embodiment.

FIG. 25 shows a cascaded electrostatic actuator 2500 having curved inner layers 1401 and curved outer layers 1402, in accordance with an embodiment. The curved inner layers 1401 and curved outer layers 1402 can define a stack 2502. A substrate or housing 2501 can at least partially enclose a stack 2502. A lateral gap 2515 can allow the inner layers 1401 and outer layers 1402 to substantially flatten (become less curved) as the actuator 2500 actuates.

As shown in FIG. 25, the inner layers 1401 and the outer layers 1402 are bent such that the stiffness thereof for extension of the actuator 2400 is greater than the stiffness thereof for contraction of the actuator 2400. Alternatively, the inner layers 1401 and the outer layers 1402 can be bent in the opposite direction, such that the stiffness thereof for extension of the actuator 2400 would be less than the stiffness thereof for contraction of the actuator 2400.

The ratio of the stiffness of the inner layers 1401 and the outer layers 1402 for extension with respect to the stiffness of the inner layers 1401 and the outer layers 1402 for contraction can be determined, at least in part, by the curvature of the inner layers 1401 and the outer layers 1402. Thus, the curvature of the inner layers 1401 and the outer layers 1402 can be used to fine tune this ratio.

An arm 2511 can extend from the housing 2501 and can move in response to actuation of the actuator 2500. Since the inner layers 1401 and the outer layers 1402 are curved, the stack 2502 can have different stiffness for different directions of travel of the arm 2511.

For example, the stack 2502 can be comparatively more stiff with respect to extension of the arm 2511 (such as when the actuator 2500 is actuated) from the housing 2501. The stack 2502 can be comparatively less stiff with respect to withdrawal of the arm 2511 into the housing 2501 (such as when the actuator is unactuated).

When the actuator 2500 is extended, the inner layers 1401 and the outer layers 1402 move into and close the lateral gap 2515. Once the lateral gap 2515 has been closed (the inner layers 1401 and the outer layers 1402 contact the housing 2501), then the stiffness of the inner layers 1401 and the outer layers 1402 can increase substantially.

Further extension of the actuator 2500 can result in binding or budding of the inner layers 1401 and the outer layers 1402. Such binding or budding of the inner layers 1401 and the outer layers 1402 can be used to lock the actuator 2500 in the actuated, e.g., extended, state.

Figure 26:
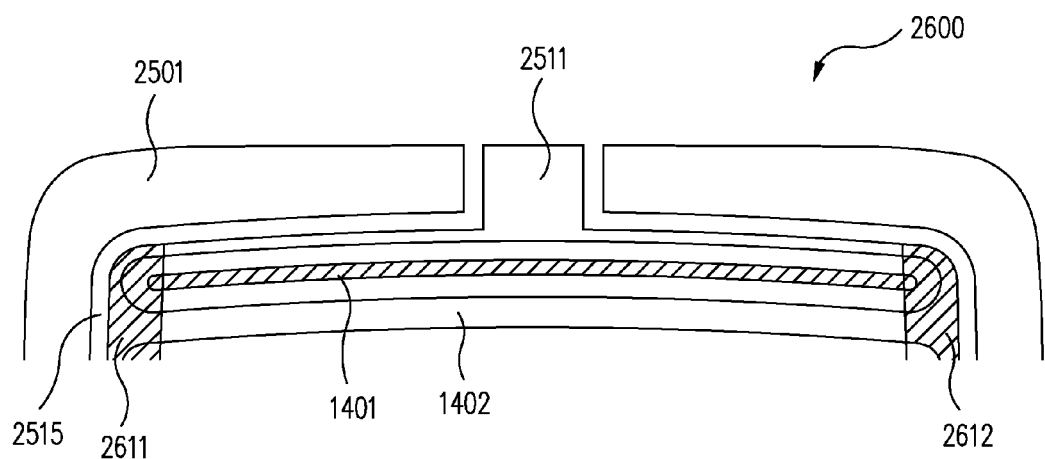
FIG. 26 shows a cascaded electrostatic actuator having curved inner and outer layers, in accordance with an embodiment.

FIG. 26 shows a cascaded electrostatic actuator 2600 having curved inner layers 1401 and curved outer layers 1402, in accordance with an embodiment. The inner layers 1401 and the outer layers 1402 are curved in a direction opposite those of FIG. 25, such that the stiffness thereof for extension of the actuator 2400 would be less than the stiffness thereof for contraction of the actuator 2400.

With the inner layers 1401 and the outer layers 1402 curved as shown in FIG. 26, contraction of the actuator 2500 can result in binding or buckling of the inner layers 1401 and the outer layers 1402. Such binding or buckling of the inner layers 1401 and the outer layers 1402 can be used to lock the actuator 2500 in the actuated, e.g., contracted, state.

Polysilicon supports 2611 can be used to maintain the inner layers 1401 in position with respect to the outer layers 1402. The polysilicon supports 2611 and 2612 can be used to provide electrical contact to the inner layers 1401. The polysilicon supports 2611 and 2612 can be used to provide electrical contact to selected ones of the inner layers 1401 and the outer layers 1402.

Figure 27:
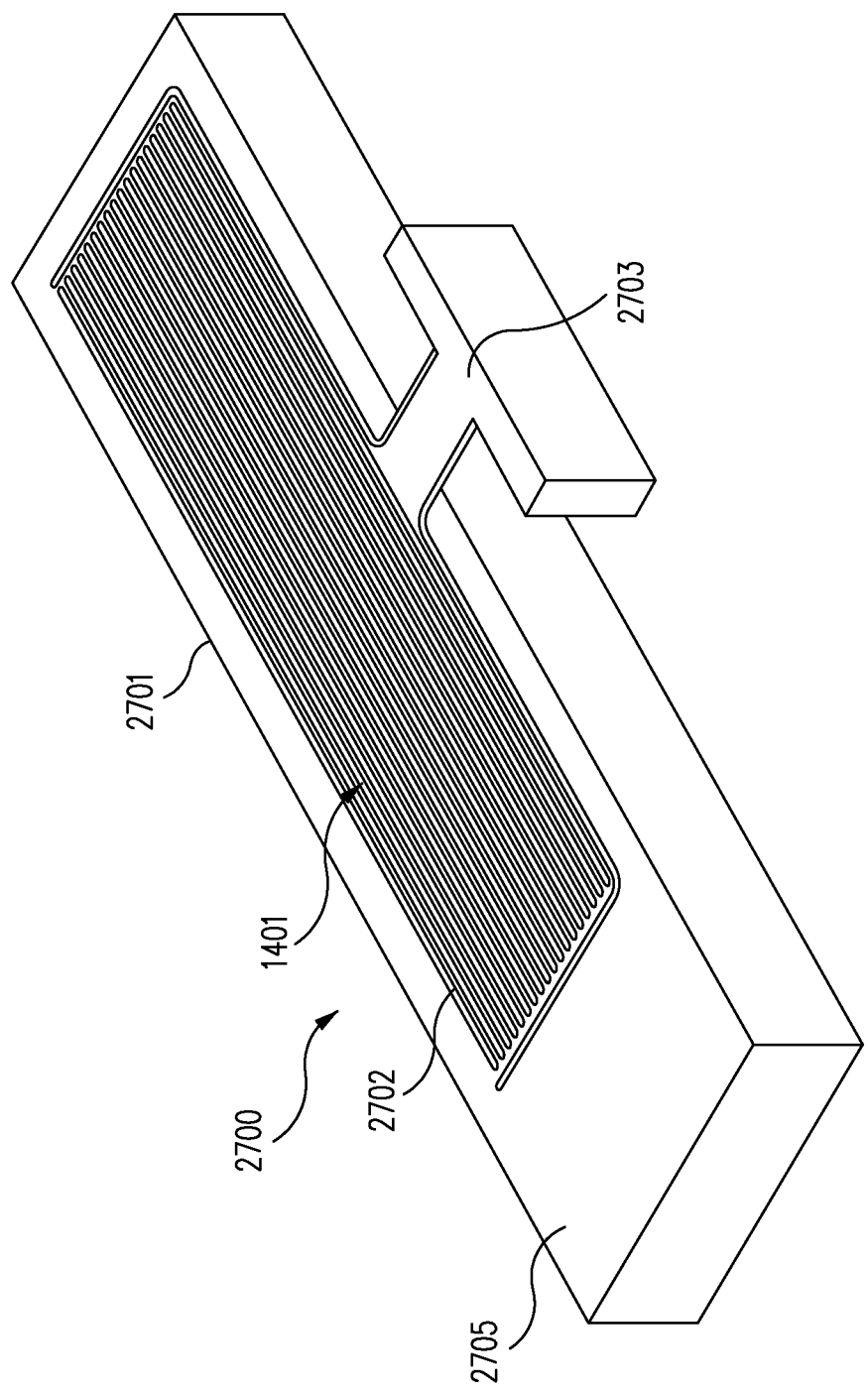
FIG. 27 shows a cascaded electrostatic actuator, in accordance with an embodiment.

FIG. 27 shows a cascaded electrostatic actuator 2700 having a single column of cells 1400, in accordance with an embodiment. The cells 1400 are not staggered (are all substantially in line with one another). The cells 1400 define a stack 2702.

The cells 1400 can be disposed within a substrate or housing 2701 that at least partially encloses a stack 2702. An arm 2703 can extend from the housing 2701 and moves in response to actuation of the actuator 2700. Thus, the application of a voltage to the actuator 2700 can result in the arm 2703 being pulled at least somewhat into the housing 2701.

The actuator 2700 can comprise any desired number of cells, any number of columns, in any desired configuration. The cells 1400 can be either staggered or non-staggered. All of the cells 1400 can be actuated simultaneously to provide snap in operation. Selected cells 1400 can be actuated serially, to provide more controlled, partial, and/or continuous operation.

A contact pad area 2705 can be provided for the formation of electrical contacts thereon. Such electrical contact can facilitate electrical connection to the actuator 2700.

Figure 28:
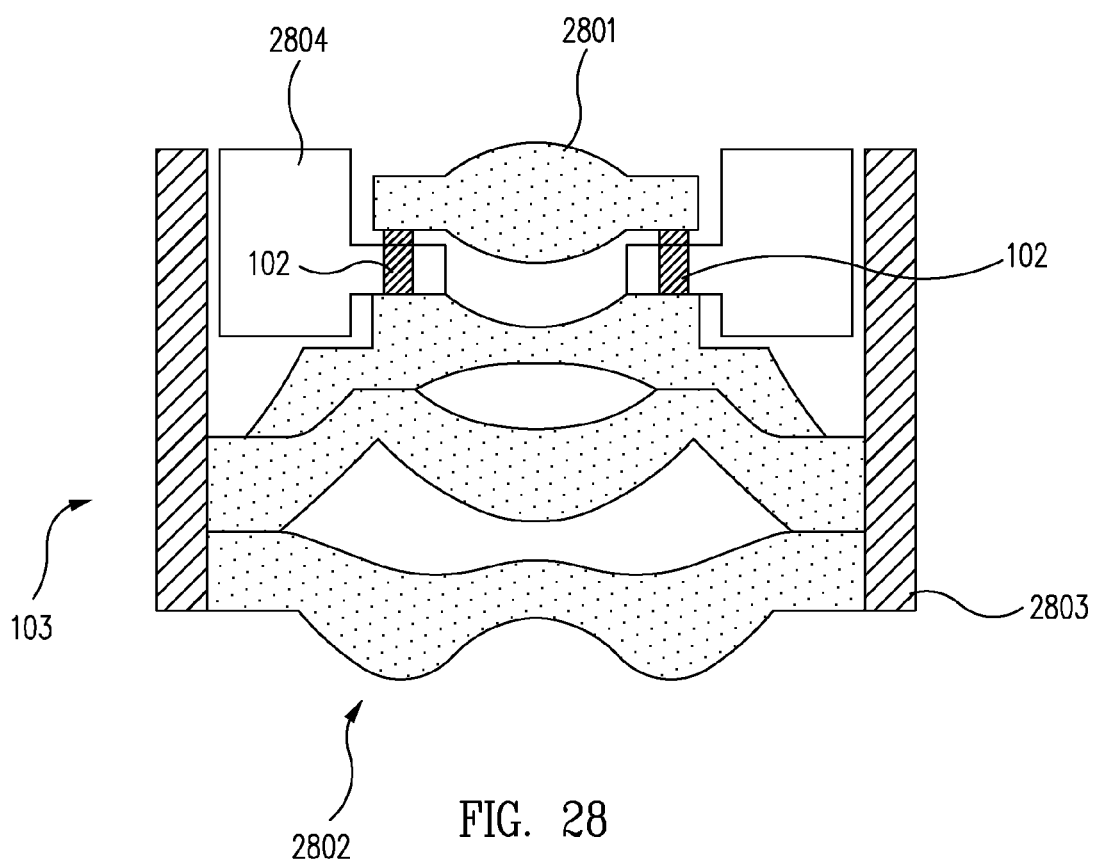
FIG. 28 shows a lens assembly having a cascaded electrostatic actuator configured to move a lens thereof so as to effect focusing of a camera, in accordance with an embodiment.

FIG. 28 shows a lens assembly 103 having a pair of cascaded electrostatic actuators 102 configured to move a movable lens 2801 thereof, so as to effect focusing of a camera (such as the camera 101 of FIG. 1), in accordance with an embodiment. The movable lens 2801, as well as other lenses 2802, can be disposed with a lens barrel 2803 or the like. A lens ring 2804 can support the movable lens 2801, other lenses 2802, and the actuators 102 within the lens barrel 2803.

Any desired number of actuators 102 can be used in a given application. For example, one, two, three, four, or more actuators 102 can be used to move the lens 2801. The actuators can be generally symmetrically disposed about a periphery of the lens 2801.

In a similar manner, a lens or other optical component can be moved to facilitate zoom or optical image stabilization (OIS). A lens, other optical component, or a non-optical component can be move using one or more actuators 102 for any desired reason.

Figure 29:
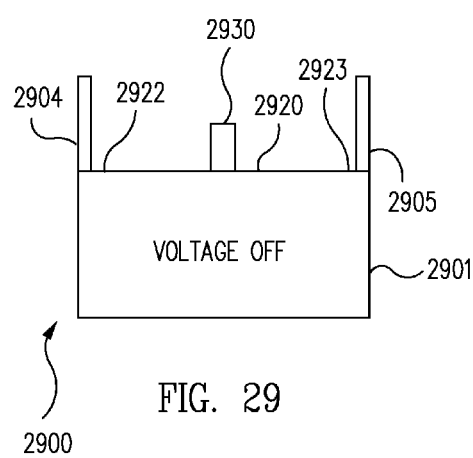
FIG. 29 shows a cascaded electrostatic actuator configured for angular motion and configured for linear motion, with the actuator in an unactuated state (with a voltage off), in accordance with an embodiment.

FIG. 29 shows a cascaded electrostatic actuator 2900 configured for angular motion and configured for linear motion, in accordance with an embodiment. The actuator 2900 is in an unactuated state (with a voltage off). The actuator 2900 comprises a stack 2901. The stack 2901 is in an extended or non-contracted state. Two side arms, 2904 and 2905, extend vertically from the stack 2901. The two side arms, 2904 and 2905, are disposed proximate sides 2922 and 2923 of the stack 2901. A central arm 2930 extends vertically from a central portion 2920 of the actuator 2901.

Figure 30:
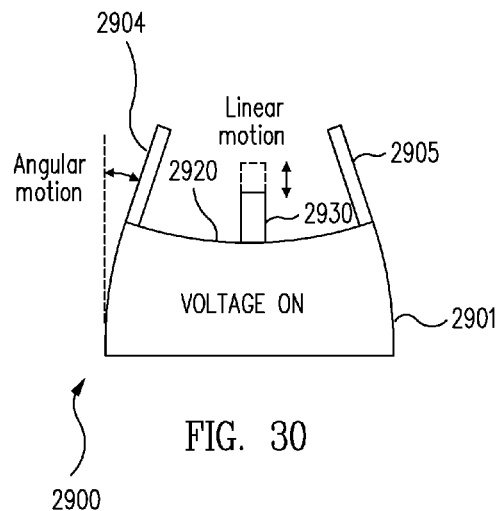
FIG. 30 shows the cascaded electrostatic actuator of FIG. 29 in an actuated state (with a voltage on), in accordance with an embodiment.

FIG. 30 shows the actuator 2901 of FIG. 29 in an actuated state (with a voltage on), in accordance with an embodiment. The stack 2901 is thus in a contracted state. The two side arms, 2904 and 2905, have rotated to provide angular motion of the distal ends thereof. The central arm 2930 have moved linearly downward.

Such rotation of the two side arms, 2904 and 2905, is due to the comparatively greater stiffness of a peripheral portion, e.g., the sides, 2922 and 2923, of the stack 2901 as compared to the stiffness of the central portion 2920 of the stack 2901. Such greater stiffness of the sides, 2922 and 2923, of the stack 2901 prevent the sides, 2922 and 2923, of the stack 2901 from contracting substantially while the lesser stiffness of the central portion 2920 of the stack 2901 allows the central portion 2920 to contract substantially.

Figure 31:
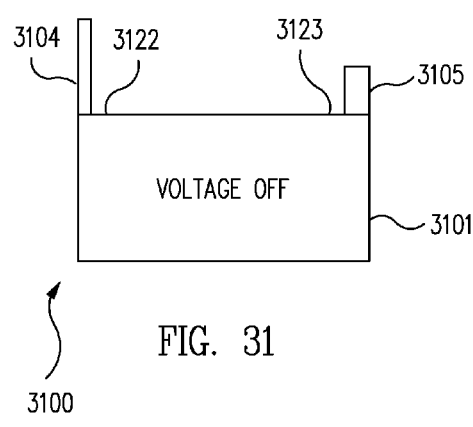
FIG. 31 shows a cascaded electrostatic actuator configured for angular motion and configured for linear motion, with the actuator in an unactuated state (with a voltage off), in accordance with an embodiment.

FIG. 31 shows a cascaded electrostatic actuator 3100 configured for angular motion and configured for linear motion, in accordance with an embodiment. The actuator 3100 is in an unactuated state (with a voltage off). The actuator comprises a stack 3101. The stack 2901 is in an extended or non-contracted state. A left arm 3104 and a right arm 3105 extend vertically. The left arm 3104 and the right arm 3105 are disposed proximate left side 3122 and the right side 3123 of the actuator 2901, respectfully.

Figure 32:
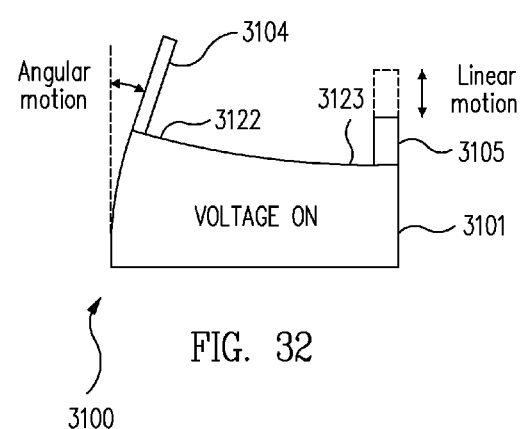
FIG. 32 shows the cascaded electrostatic actuator of FIG. 31 in an actuated state (with a voltage on), in accordance with an embodiment.

FIG. 32 shows the actuator 3101 of FIG. 30 in an actuated state (with a voltage on), in accordance with an embodiment. The stack 3101 is thus in a contracted state. The left arm 3104 has rotated to provide angular motion of the distal end thereof. The right arm 3105 has moved linearly downward.

Such rotation of the arms 3104 is due to the comparatively greater stiffness of the left side 3122 of the stack 3101 as compared to the stiffness of the right side 3123 of the stack 3101. Such greater stiffness of the left side 3122 of the stack 3101 inhibits the right sides 3122 of the stack 3101 from contracting substantially while the lesser stiffness of the left side 3123 of the stack 3101 allows the right side 3123 to contract substantially.

The stack 3101 can be configured to bend in various different directions by varying the stiffness of portions thereof accordingly. The stack 3101 can be configured to bend in more than one direction by varying the stiffness of portions thereof accordingly. For example, the stack 3101 can be configured to bend to the right as shown in FIG. 32 while simultaneously bending upwardly, out of the plane of the paper.

Figure 33:
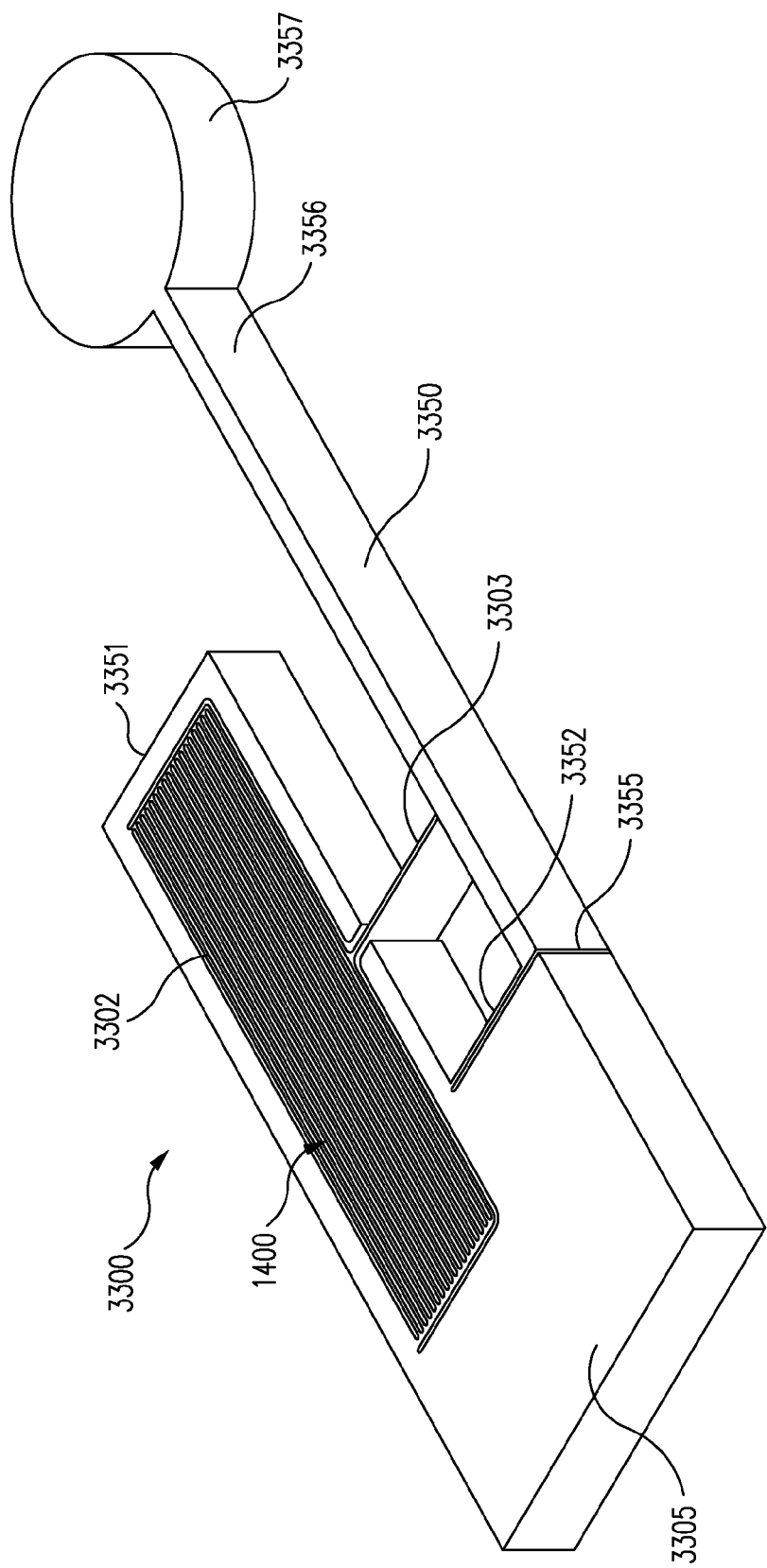
FIG. 33 shows a shutter assembly having a cascaded electrostatic actuator configured for angular motion, in accordance with an embodiment.

FIG. 33 shows a cascaded electrostatic actuator 3300 having a single column of cells 1400, in accordance with an embodiment. The actuator 3300 has a single column of cells 1400. The cells 1400 are not staggered (are all substantially in line with one another). The cells 1400 define a stack 3302. The cells 1400 are disposed within a substrate or housing 3301 that at least partially encloses a stack 3302.

A first arm 3303 extends from the housing 3301 and moves in response to actuation of the actuator 3300. Thus, the application of a voltage to the actuator 3300 can result in the first arm 3303 being pulled at least somewhat into the housing 3301.

The actuator 3300 can comprise any number of cells 1400 and any number of columns, in any desired configuration. The cells 1400 can be either staggered or non-staggered. A contact pad area 3305 can be provided for the formation contact pads thereon to facilitate electrical connection to the actuator 3300, as discussed herein.

A second arm 3350 can be attached to the first arm 3303 such that linear movement of the first arm 3303 results in rotation of the second arm 3350. A flexure 3352 can attach a proximal end 3355 of the second arm 3350 to the housing 3301 to facilitate such rotation.

A shutter blade 3351, for example, can be attached to the distal end 3356 of the second arm 3350. Rotation of the second arm 3350 can result in movement of the shutter blade 3351 so as to either open or close an aperture.

Figure 34:
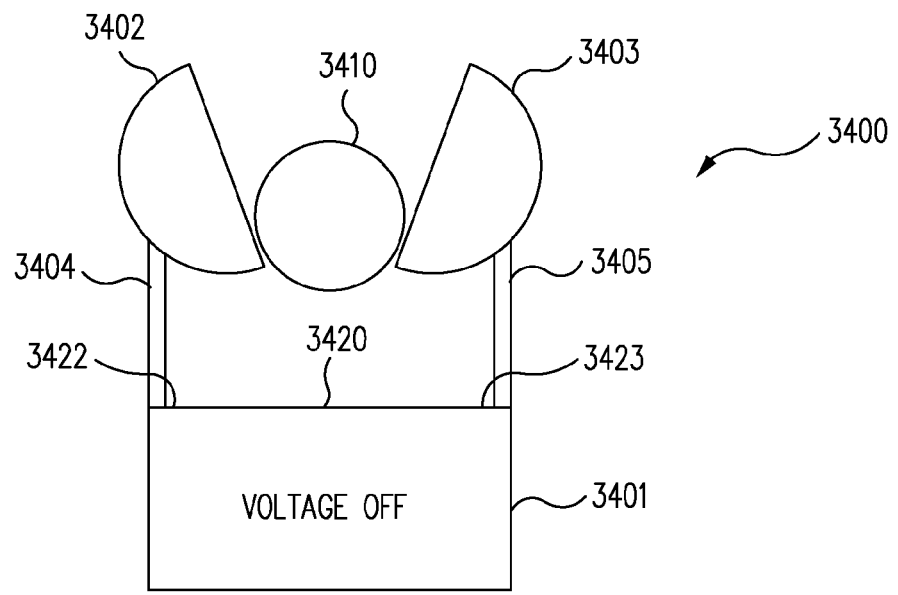
FIG. 34 shows a shutter assembly having a cascaded electrostatic actuator configured for angular motion in an unactuated state (with a voltage off), in accordance with an embodiment.

FIG. 34 shows a shutter assembly 3400 having a cascaded electrostatic actuator 3401 in an unactuated state (with the voltage off), in accordance with an embodiment. The shutter assembly 3400 is configured for angular motion of two shutter blades 3402 and 3403.

Each shutter blade 3402 and 3403 can be attached to an arm 3404 and 3405, respectively. Such angular motion can cause the two shutter blades 3402 and 3403 to rotate so as to occlude an aperture 3410, such as the aperture of a camera.

Figure 35:
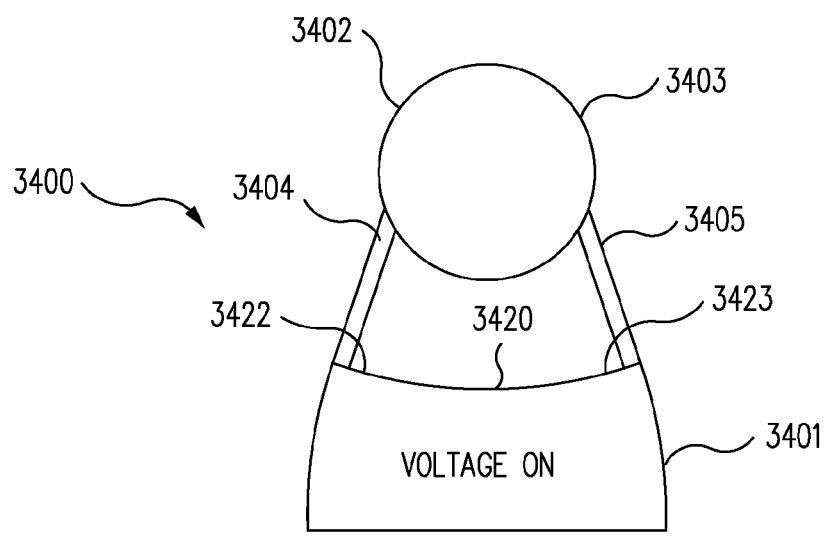
FIG. 35 shows a shutter assembly having a cascaded electrostatic actuator configured for angular motion in an actuated state (with a voltage on), in accordance with an embodiment.

FIG. 35 shows the shutter assembly 3400 of FIG. 34 having the actuator 3401 in an actuated state (with a voltage on), in accordance with an embodiment. In the actuated state, the two shutter blades 3402 and 3403 occlude the aperture 3410.

In the actuated state, a central portion 3420 of the actuator 3401 contracts substantially and end portions 3422 and 3423 do not contract substantially, such that the resultant movement of the shutter blades 3402 and 3403 has a substantial rotational component. The use of such an actuator to provide rotational movement is discussed further with respect to FIGS. 29-32 herein.

Alternatively, the shutter assembly 3400 can be configured such that the aperture 3410 is occluded with the voltage off and is not occluded with the voltage on. In either instance, the shutter assembly can be used to facilitate a camera exposure. For example, an exposure can be initiate electronically, such as by zeroing a charge coupled device, and can be ended mechanically, such as by occluding the aperture 3410.

The actuator 3401 can provide rotational movement for use in a variety of different applications. For example, the arms 3404 and 3405 can define mechanical manipulators such as tweezes, cutters, scoops, hooks, seals, mechanical probes or can define electrical manipulators such as electrical probes, current or voltage providing pins, or any other desired items. Other examples of electrical manipulators include switches and relays. The actuator 3402 can operate an iris or an optical device, such as a camera. The actuator 3402 can move filters of an optical device, such as a camera. The actuator 3402 can be used to define a spatial filter, a tunable filter, or any other type of filter.

Figure 36:
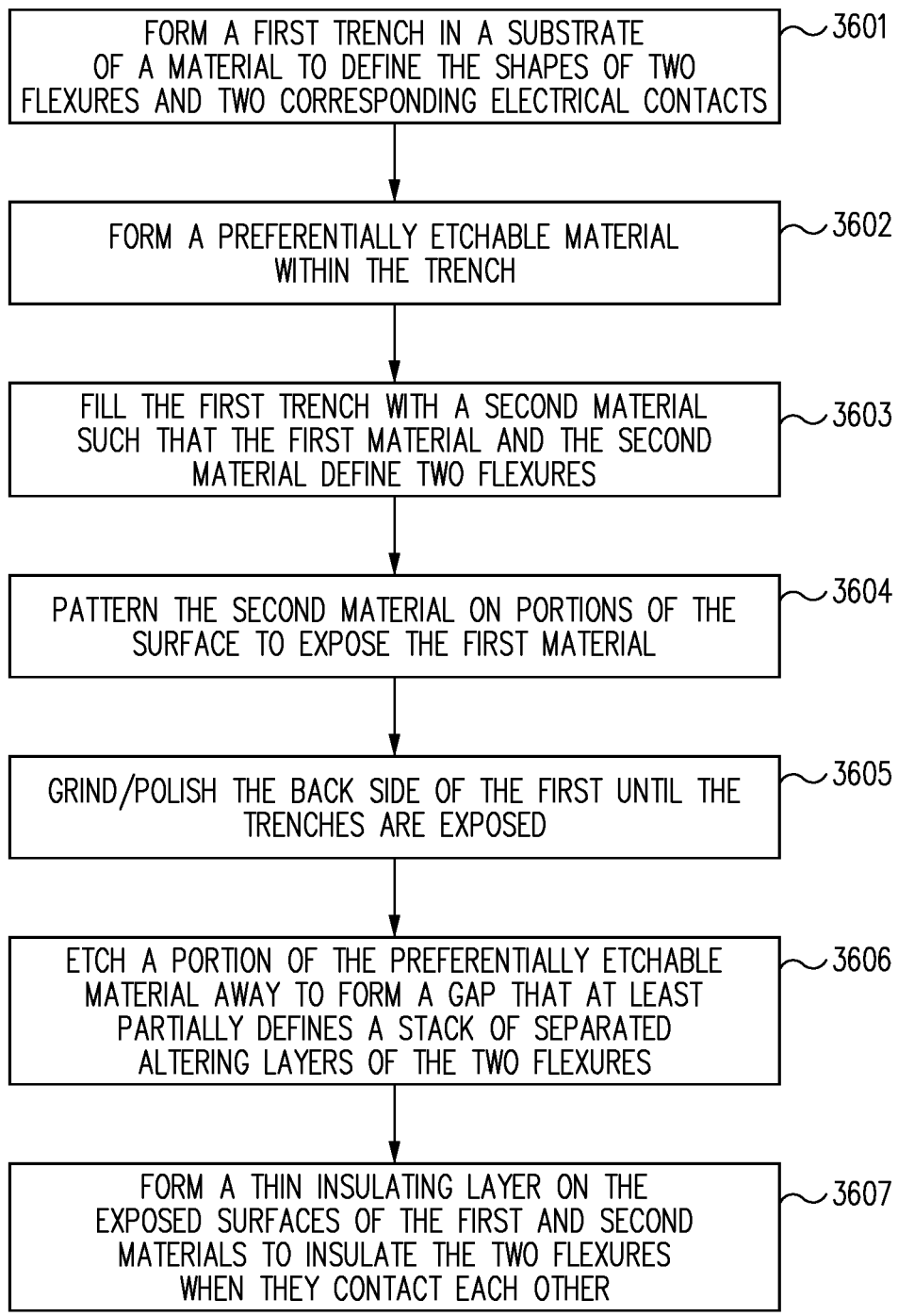
FIG. 36 is a flow chart showing a method for forming a cascaded electrostatic actuator, in accordance with an embodiment.

FIG. 36 is a flow chart showing a method for forming a cascaded electrostatic actuator, in accordance with an embodiment. A trench can be formed in a substrate of a first material to define the shapes of two flexures and corresponding electrical contacts, as indicated in block 3601.

The first material can be single crystalline silicon, for example. The trench can be formed by etching, for example. The trench can be formed by various other methods such as ion milling, laser ablation, and the like. The trench can be formed by any desired method.

A preferentially etchable material can be formed with the trench, as indicated in block 3602. The preferentially etchable material can be silicon dioxide, for example. The preferentially etchable material can be any material that is preferentially etchable with respect to single crystalline silicon. The preferentially etchable material can merely form a layer upon the walls of the trench, rather than filling the trench completely. Thus, the trench can remain defined after deposition of the oxide.

The trench can be filled with a second material, as indicated in block 3603. The second material can be polycrystalline silicon, for example. The second material can substantially cover the surface of the substrate. The first material and the second material can define two flexures or two sets of flexures. The two sets of flexures can define a stack.

The second material can be patterned on portion of the surface of the substrate, as indicated in block 3604. The second material can be patterned so as to expose portions of the surface of the first material.

The reversed or back side of the first material can be ground and/or polished until the trenches are exposed, as indicated in block 3605. In this manner, portions of the substrate that would otherwise inhibit operation of the cascaded electrostatic actuator are removed.

A portion of the preferentially etchable material can be etched away to form a gap that at least partially defines a stack of separated alternating layers of the two flexures, as indicated in block 3606.

A thin insulating layer can be formed on the exposed surfaces of the first and second materials to insulate the two flexures when the two flexures contact on another, as indicated in block 3607. The insulating layer can be formed of silicon dioxide, for example.

As used herein, the term layer can be defined to include any structures suitable for at least partially defining an actuator that contracts, e.g., two or more layers thereof move closer together, when charges of opposite polarities are place on at least a pair thereof. Examples of layers can include flexures, fingers, electrodes, plates, and the like.

Although the examples of embodiments described herein are formed of single crystalline silicon and polysilicon, those skilled in the art will appreciate that various other materials may similarly be used. For example, embodiments can be formed from germanium, sapphire, ceramics, polymers, metals, and/or various other materials.

As discussed herein, an electrostatic actuator having enhanced travel and/or force capability is provided. The electrostatic actuator can be used in various MEMS application where substantial travel and force are desired, such as for operating a shutter of a miniature camera or such as for rapidly focusing, zooming, or providing optical image stabilization (OIS) for a miniature camera.

As discussed herein, a cascaded electrostatic actuator can be formed from a substantially planar substrate. The cascaded electrostatic actuator can be formed in a plane of the substrate. Motion of the cascaded electrostatic actuator can be substantially entirely within the plane of the substrate. Alternatively, a substantial portion of the motion can be outside of the plane of the substrate. The substrate can comprises a semiconductor material.

Having discussed above embodiments of cascaded electrostatic MEMS actuators and some applications therefore, a further application of such actuators in an actuator/sensor is discussed below. Thus, examples of suitable actuators for the actuator/sensor can include the cascaded electrostatic MEMS actuators discussed above. The use of such actuators in an actuator/sensor is by way of example only, and not by way of limitation. The above discussed actuators can be used in various other applications and the actuator/sensor discussed below can use various other actuators.

FIGS. 37-40 show examples of such actuator/sensors according to embodiments thereof. An example of an application of such actuator/sensors in a keyboard is discussed. The use of such actuator/sensors in a keyboard is by way of example only and not by way of limitation. The actuator/sensors can be used in various other applications.

Figure 37:
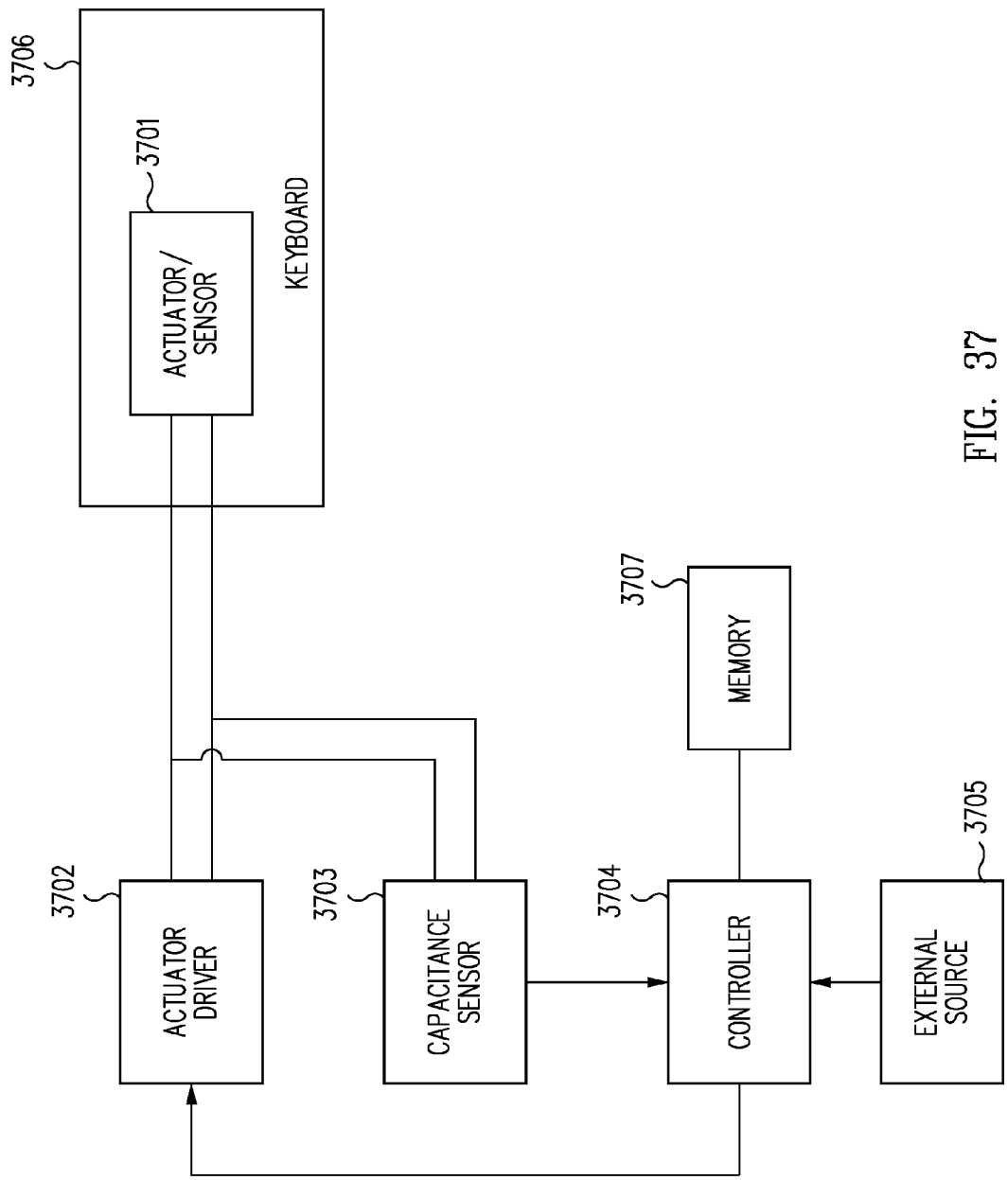
FIG. 37 is a block diagram of an actuator/sensor used in a keyboard, in accordance with an embodiment.

Referring now to FIG. 37, an actuator/sensor 3701 can comprise a MEMS actuator, according to an embodiment. For example, the actuator/sensor 3701 can be an electrostatic MEMS actuator. The actuator/sensor 3701 can be a substantially unmodified electrostatic MEMS actuator. The actuator/sensor 3701 can function as both an actuator and a sensor. The actuator/sensor 3701 can function as both an actuator and a sensor simultaneously. Thus, the actuator/sensor 3701 can cause motion while sensing a parameter, such as a capacitance of the actuator/sensor 3701. The sensed parameter can be representative of another parameter, such as the position of the actuator/sensor 3701. Thus, the position of the actuator/sensor 3701 or an item attached thereto can be indirectly sensed or determined.

The actuator/sensor 3701 can comprise a gap closing MEMS actuator. In a gap closing actuator, plates or electrodes move closer to one another when a voltage is applied to the electrodes. Thus, a gap between adjacent electrodes of the gap closing actuator becomes smaller or closes as the actuator moves.

The actuator/sensor 3701 can comprise a constant gap MEMS actuator. In a constant gap actuator, interdigitated fingers, teeth, or electrodes move with respect to one another when a voltage is applied to the electrodes. However, a gap between adjacent electrodes remains substantially constant. A comb drive is an example of a constant gap actuator.

The capacitance of the actuator/sensor 3701 can be sensed. The capacitance of the actuator/sensor 3701 is directly proportional to the overlap of adjacent electrodes (such as in a comb actuator) and is inversely proportional to the distance between adjacent electrodes (such as in a gap closing actuator). Thus, measuring the capacitance of the actuator/sensor 3701 provides an indication of the amount of movement of the actuator/sensor 3701.

The capacitance of the actuator/sensor 3701 will vary whether the actuator/sensor 3701 is moved as a result of being electrically driven or is moved due to the application of an external force. Thus, the capacitance of the actuator/sensor 3701 will vary when the actuator/sensor 3701 is moved because a voltage applied to the electrodes thereof has been changed and the capacitance of the actuator/sensor 3701 will vary when the actuator/sensor 3701 is moved because a person has pressed a key 3802 (FIGS. 38 and 39) to which the actuator/sensor 3701 is attached.

An actuator driver 3702 can provide a drive signal to the actuator/sensor 3701. Thus, the actuator driver 3702 can apply a controlled voltage to the electrodes of the actuator/sensor 3701 so as to result in a desired amount of movement of the actuator/sensor 3701 and/or so as to result in a desired amount of force or resistance to movement of the actuator/sensor 3701.

Resistance to movement of the actuator/sensor 3701 can be resistance to an externally applied force. For example, resistance to movement of the actuator/sensor 3701 can be resistance to a manual operation of a control, such as pressing the key 3802.

A capacitive sensor 3703 can sense the capacitance of the actuator/sensor 3701. The capacitive sensor 3703 can be any type of capacitive sensor that is suitable for sensing the capacitance of the electrodes, e.g., teeth, fingers, or plates, of the actuator/sensor 3701.

Examples of methods for determining capacitance include measuring the rate of voltage rise/fall while charging and/or discharging the capacitor, passing a known high-frequency alternating current through the capacitor and measuring the voltage across it, including the capacitor in a bridge circuit, and including the capacitor in an oscillator and determining the resonant frequency of the oscillator. Embodiments can use any suitable method for determining the capacitance of the actuator/sensor 3701. Thus, the capacitive sensor 3703 can use any such method.

The capacitive sensor 3703 can provide a signal representative of the capacitance of the actuator/sensor 3701 to a controller 3704. The capacitive sensor 3703 can provide a signal that indicates that the key 3802 of a keyboard 3706, for example, has been pressed. Generally, the harder the key 3802 is pressed, the farther the actuator/sensor 3701 will move and the greater the change in capacitance of the actuator/sensor 3701 will be.

The controller 3704 can be a processor, such as a microprocessor. The microprocessor can be either a general purpose microprocessor or a dedicated, e.g., custom microprocessor. The controller 3704 can be a dedicated controller of the keyboard 3706, for example.

The controller 3704 can provide a control signal to the actuator driver 3702 to cause movement and/or resistance of the actuator/sensor 3701. The control signal and the consequent movement and/or resistance of the actuator/sensor 3701 can be dependent upon the capacitance of the actuator/sensor 3701 and/or can be dependent upon any other factor or parameter. For example, the movement and/or resistance of the actuator/sensor 3701 can be dependent upon the first derivative (the rate of change) of the capacitance and/or the second derivative (the rate of change of the first derivative) of the capacitance. The movement and/or resistance of the actuator/sensor 3701 can be dependent upon any combination of parameters.

The movement and/or resistance of the actuator/sensor 3701 can define tactile feedback. For example, the tactile feedback can provide a person with a positive indication that the key 3802 of the keyboard 3706 has been properly pressed.

A memory 3707 can store software and/or parameters that are used to operate the actuator/sensor 3701. For example, the memory 3707 can store software and/or parameters that are used to define the tactile feedback.

The controller 3704 can receive a signal from an external source 3705. The external source 3705 can be another controller, such as the microprocessor of a computer to which the keyboard 3706 is connected. The external source 3705 can turn on, turn off, or modify aspects of the operation of the actuator/sensor 3701.

Figure 38:
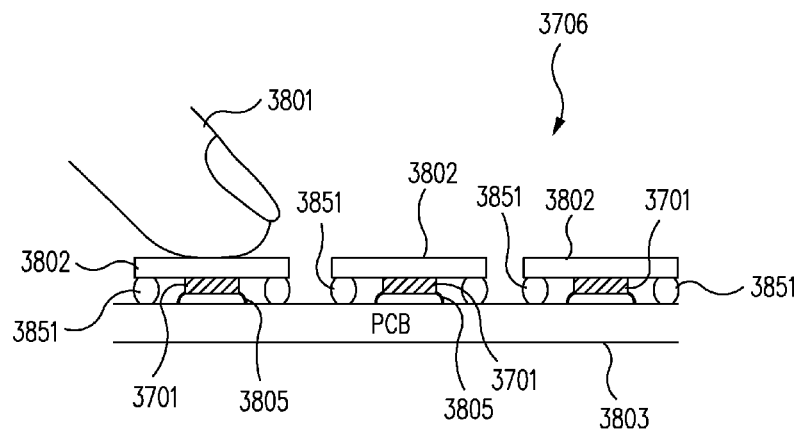
FIG. 38 is a side view of the actuator/sensor of FIG. 1, in accordance with an embodiment.

Referring now to FIG. 38, the keyboard 3706 can comprise one or more actuator/sensors 3701, according to an embodiment. One or more of the keys 3802, such as substantially all of the keys 3802, of the keyboard 3706 can have one actuator/sensor 3701 disposed generally therebeneath for sensing that the key 3802 has been pressed, such as by a finger 3801. The keys 3802 can be mounted to the actuator/sensors 3701, such as to a moving arm of actuator/sensors 3701. The actuator/sensors 3701 can be mounted to a printed circuit board (PCB) 3803, such as via the use of solder 3805.

Stiffeners 3851 can be used to add stiffness to the key 3802, to provide structural support for the key 3802, and/or to limit the motion or degrees of freedom of the motion of key the 3802. The stiffeners 3851 can be one or more flexures, for each key 3802. The stiffeners 3851 can be a resilient material, such as a polymer.

A user can directly touch or manipulate the actuator/sensor 3701. Thus, no separate key 3702 or other interface or manual control is required.

Figure 39:
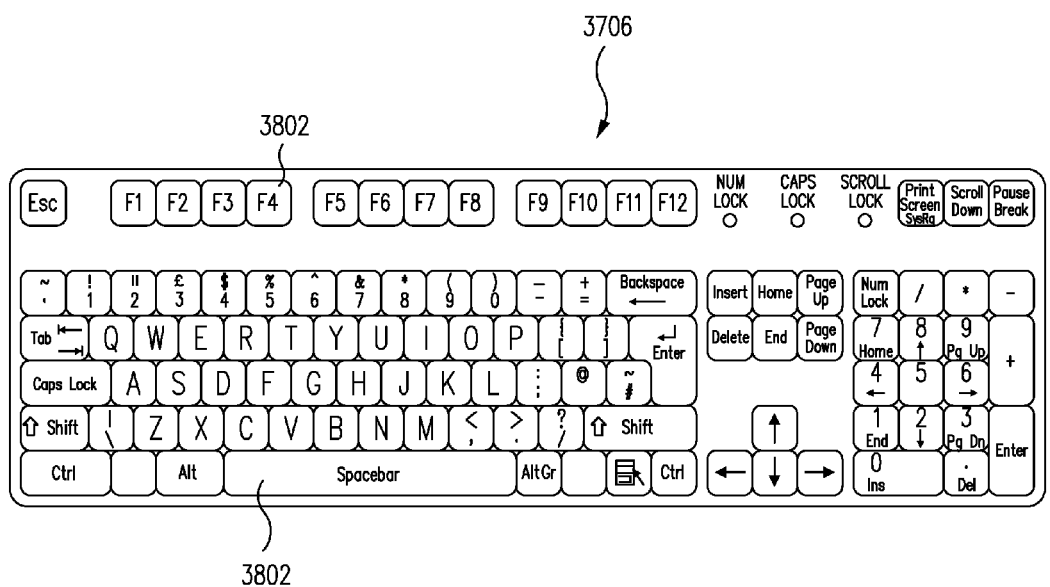
FIG. 39 is the keyboard of FIG. 1, in accordance with an embodiment.

Referring now to FIG. 39, the keyboard 3706 can be configured such that movement of the keys 3802 is sensed by the actuator/sensors 3701, according to an embodiment. As one of the keys 3802 is pressed, tactile feedback can be provided.

For example, one of the keys 3802 can initially provide resistance to being pressed. Then, after the key 3802 has travelled a predetermined distance, the resistance can be lessened or removed. The key 3802 can click or vibrate in response to being pressed. Any desired tactile response can be provided. Any desired profile of resistance to movement of the key 3802 and/or actuator/sensor 3701 can be provided. The presence or absence of such a tactile response, as well as the type of the tactile response, can be determined by a signal from the external source 3705 and/or from software/parameters stored in the memory 3707.

Figure 40:
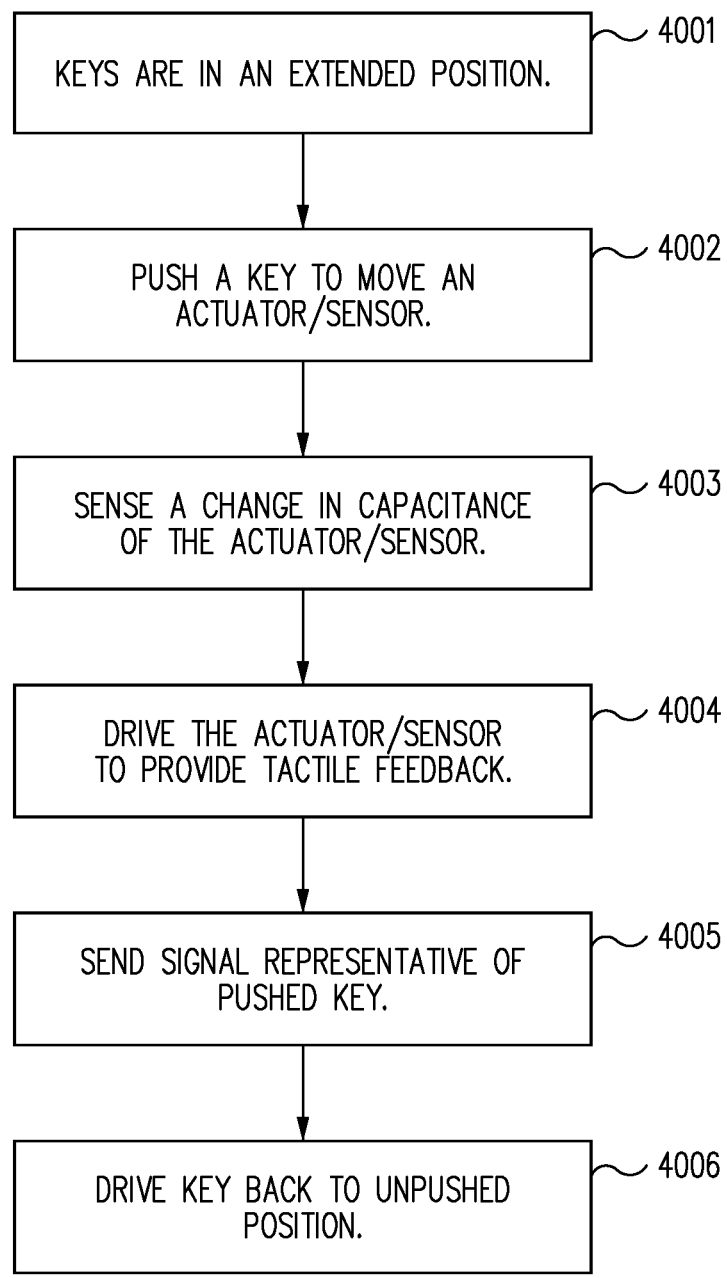
FIG. 40 is a flow chart showing an example of operation of the actuator/sensor of FIG. 1, in accordance with an embodiment.

Referring now to FIG. 40, operation of the actuator/sensors 3701 in the keyboard 3706 is described, according to an embodiment. The keys 3802 of the keyboard 3706 can be in an extended position, as indicated in block 4001. The extended position can result from the actuator/sensors 3701 being in an unactuated state. Alternatively, the actuator/sensors 3701 can be in a partially actuated state.

A key 3802 can be pushed, as indicated in block 4002. The key 3802 can be pushed by a typist during typing, for example. Pushing one of the keys 3802 can cause the dedicated actuator/sensor 3701 for that key 3802 to move, e.g., travel to another position or state.

Such movement of the actuator/sensor 3701 can cause a change in the capacitance thereof, as indicated in block 4003. The change in the capacitance of the actuator/sensor 3701 can be sensed by the capacitive sensor 3703.

The actuator/sensor 3701 can be driven by the actuator driver 3702 to provide tactile feedback, as indicated in block 4004. The controller 3704 can control the actuator driver 3702 to provide the tactile feedback. The controller 3704 can use parameters provided by software and/or parameters stored in the memory 3707 to at least partially define the tactile feedback. For example, the software and/or parameters stored in the memory 3707 can define a travel versus resistance profile for the keys 3802. Each key 3802 can have a unique travel versus resistance profile.

The controller 3704 can use a signal provided by the external source 3705 to at least partially define the tactile feedback. For example, the external source can be a selector switch and a position of the rotary switch can determine whether the tactile feedback is a change in resistance, a click, vibration, or any other type of tactile feedback.

A signal representative of the pushed key 3802 can be sent to a computer, such as to the microprocessor of the computer, as indicated in block 4005. After the key 3802 has been pressed, the key 3802 can be driven back to the unpressed or initial position thereof, as indicated in block 4006.

According to one or more embodiments, each electrostatic MEMS actuator can have a dedicated capacitive sensor 3703. A single capacitive sensor 3703 can be used to determine the capacitance of a plurality of actuator/sensors 3701, such as by sequentially polling each of the actuator/sensors 3701.

A manual control can have a plurality of actuator/sensors 3701 and visa versa. Thus, each key 3802 can be attached to more than one actuator/sensor 3802 and visa versa, for example.

When a position of the actuator/sensor 3701 is discussed herein, this discussion is generally referring to the position of a moving part of the actuator/sensor 3701. Thus, the position of the actuator/sensor 3701 can be the state (degree of actuation) of the actuator/sensor 3701. For example, the actuator/sensor 3701 can have an arm, ram, or other structure that moves when a voltage is applied to the electrodes of the actuator/sensor 3701. Thus, the actuated position of actuator/sensor 3701 can refer to the actuated position, e.g., retracted position, of the arm, for example.

A "manual control" as the term is used herein can refer to any type of control that a person can manually move to obtain a response. For example, the control can be a key, a button, a toggle, a knob, or the like. Generally, the term "key" as used herein refers to a key of a keyboard. However, a key that cooperates with a lock can be considered to be a manual control.

A "click" as the term is used herein can be either an audible click or an inaudible click. An inaudible click can be felt by a user pushing a button, for example.

A "printed circuit board" as the term is used herein, can be any substrate upon which electronic devices or components such an electrostatic MEMS actuator can be mounted. Examples of printed circuit boards can include flexible circuits, semiconductor substrates, metal substrates, and non-metal substrates.

An "effector" as the term is used herein, can be any structure that is configured to apply force to an actuator. The effector can be an arm or a ram of the actuator. The effector can be a structure that is attached or linked to the arm or ram. The effector can be a manual control such as a key, a button, a toggle, or a knob.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected is:

1. A device comprising:
   an electrostatic MEMS actuator comprising a plurality of parallel plate electrodes arranged in a cascaded manner in a stack;
   a force effector configured to facilitate the application of an external force to the electrostatic MEMS actuator; and
   a capacitive sensor in electrical communication with the electrostatic MEMS actuator and configured to determine a capacitance among the cascaded electrodes of the electrostatic MEMS actuator when an external force is applied to the electrostatic MEMS actuator while the electrostatic MEMS actuator is being actuated.

2. The device as recited in claim 1, wherein the electrostatic MEMS actuator comprises a gap closing actuator.

3. The device as recited in Claim 1, wherein the electrostatic MEMS actuator comprises a constant gap actuator.

4. The device as recited in claim 1, wherein the capacitive sensor is an oscillator-type of capacitive sensor.

5. The device as recited in claim 1, wherein the force effector comprises a manual control configured move the electrostatic MEMS actuator and thus vary a capacitance of the electrostatic MEMS actuator.

6. The device as recited in claim 5, further comprising a controller configured to vary a voltage applied to the electrostatic MEMS actuator to provide tactile feedback in response to movement of the manual control.

7. The device as recited in claim 5, further comprising a controller configured to vary a voltage applied to the electrostatic MEMS actuator to reduce a resistance to movement of the electrostatic MEMS actuator in response to movement of the manual control.

8. The device as recited in claim 5, further comprising a controller configured to vary a voltage applied to the electrostatic MEMS actuator to cause the electrostatic MEMS actuator to produce a click in response to movement of the manual control.

9. The device as recited in claim 5, further comprising a controller configured to vary a voltage applied to the electrostatic MEMS actuator to cause the electrostatic MEMS actuator to produce vibration in response to movement of the manual control.

10. The device as recited in claim 5, wherein the manual control comprises at least one of a key, a button, a toggle, and a knob.

11. A switch comprising:
a manual control;
an electrostatic MEMS actuator responsive to the manual control, the electrostatic MEMS actuator comprising a plurality of parallel plate electrodes arranged in a cascaded manner in a stack; and
a capacitive sensor in electrical communication with the electrostatic MEMS actuator and configured to determine a capacitance among the cascaded electrodes of the electrostatic MEMS actuator when an external force is applied to the electrostatic MEMS actuator via the manual control while the electrostatic MEMS actuator is being actuated.

12. The switch as recited in claim 11, wherein the manual control comprises at least one of a key, a button, a toggle, and a knob.

13. A keyboard comprising:
a key;
an electrostatic MEMS actuator configured to move in response to movement of the key, the electrostatic MEMS actuator comprising a plurality of parallel plate electrodes arranged in a cascaded manner in a stack; and
a capacitive sensor in electrical communication with the electrostatic MEMS actuator and configured to determine a capacitance among the cascaded electrodes of the electrostatic MEMS actuator.

14. The keyboard as recited in claim 13, wherein the key and the electrostatic MEMS actuator are configured such that the harder the key is depressed, the more the electrostatic MEMS actuator moves.

15. The keyboard as recited in claim 13, further comprising a printed circuit board to which the electrostatic MEMS actuator is soldered.

16. The keyboard as recited in claim 13, further comprising a controller configured to vary a voltage applied to the electrostatic MEMS actuator to cause the electrostatic MEMS actuator to produce tactile feedback in response to pressing the key.

17. The keyboard as recited in claim 16, wherein the tactile response comprises a click of the key.

18. The keyboard as recited in claim 16, wherein the tactile response comprises vibration of the key.

19. The keyboard as recited in claim 16, wherein the tactile response comprises a change in resistance to movement of the key.

20. The keyboard as recited in claim 16, wherein the tactile response comprises providing comparatively more resistance to movement of the key before the key travels a predetermined distance and providing comparatively less resistance to movement of the key after the key travels the predetermined distance.

21. A method comprising:
actuating an electrostatic MEMS actuator comprising a plurality of parallel plate electrodes arranged in a cascaded manner in a stack;
applying an external force to the electrostatic MEMS actuator;
sensing a capacitance among the plurality of cascaded electrodes of the electrostatic MEMS actuator while the force is being applied; and
reacting to a change in the sensed capacitance of the electrostatic MEMS actuator.

22. The method as recited in claim 21, wherein reacting to the change in the sensed capacitance comprises moving the electrostatic MEMS actuator.

23. The method as recited in claim 21, wherein reacting to the change in the sensed capacitance comprises inhibiting movement of the electrostatic MEMS actuator.

24. The method as recited in claim 23, wherein inhibiting movement of the electrostatic MEMS actuator comprises varying a force provided by the electrostatic MEMS actuator.

25. The method as recited in claim 24, wherein varying the force provides a click of the electrostatic MEMS actuator.

26. The method as recited in claim 24, wherein varying the force provides a vibration of the electrostatic MEMS actuator.

27. The method as recited in claim 24, wherein varying the force causes the electrostatic MEMS actuator to offer comparatively more resistance to movement before the electrostatic MEMS actuator travels a predetermined distance and causes the electrostatic MEMS actuator to offer comparatively less resistance to movement after the electrostatic MEMS actuator travels the predetermined distance.

28. The method as recited in claim 26, wherein varying the force is facilitated via the use of software.

29. A device comprising:
an electrostatic MEMS actuator comprising a plurality of parallel plate electrodes arranged in a cascaded manner in a stack;
a capacitive sensor in electrical communication with the electrostatic MEMS actuator and configured to determine a capacitance among the plurality of cascaded electrodes of the electrostatic MEMS actuator; and
wherein the electrostatic MEMS actuator is configured to be touched by a person to cause a change in the capacitance thereof.

30. The device as recited in claim 29, wherein the capacitance sensor is configured to determine a capacitance of the electrostatic MEMS actuator when an external force is applied to the electrostatic MEMS actuator while the electrostatic MEMS actuator is being actuated.

* * * * *